(12) United States Patent
Kasai et al.

(10) Patent No.: US 8,128,751 B2
(45) Date of Patent: Mar. 6, 2012

(54) FILM-FORMING APPARATUS

(75) Inventors: Shigeru Kasai, Nirasaki (JP); Takashi Kakegawa, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 168 days.

(21) Appl. No.: 12/404,878

(22) Filed: Mar. 16, 2009

(65) Prior Publication Data

US 2009/0178614 A1    Jul. 16, 2009

Related U.S. Application Data

(60) Continuation of application No. 11/727,485, filed on Mar. 27, 2007, now abandoned, which is a division of application No. 10/467,293, filed as application No. PCT/JP02/01110 on Feb. 8, 2002, now Pat. No. 7,661,386.

(30) Foreign Application Priority Data

Feb. 9, 2001 (JP) ................................. 2001-034520

(51) Int. Cl.
C23C 16/455 (2006.01)
C23C 15/52 (2006.01)
C23F 1/00 (2006.01)
H01L 21/306 (2006.01)
C23C 16/06 (2006.01)
C23C 16/22 (2006.01)

(52) U.S. Cl. ... 118/715; 118/666; 118/724; 156/345.27; 156/345.34; 156/345.37

(58) Field of Classification Search ............... 118/715, 118/728, 50, 666, 724; 156/345.29, 345.33, 156/345.34, 345.35, 345.36, 345.26, 345.51, 156/345.27, 345.37
See application file for complete search history.

(56) References Cited

U.S. PATENT DOCUMENTS

| | | | |
|---|---|---|---|
| 5,280,156 A | | 1/1994 | Niori et al. |
| 5,350,480 A | * | 9/1994 | Gray .................. 156/345.26 |
| 5,366,585 A | | 11/1994 | Robertson et al. |
| 5,443,648 A | * | 8/1995 | Ohkase ................. 118/724 |
| 5,447,568 A | * | 9/1995 | Hayakawa et al. ........... 118/715 |
| 5,595,606 A | * | 1/1997 | Fujikawa et al. ............ 118/725 |
| 5,653,806 A | | 8/1997 | Van Buskirk |

(Continued)

FOREIGN PATENT DOCUMENTS

JP    7-302765    11/1995

(Continued)

OTHER PUBLICATIONS

European Search Report (Application No. EP 02 71 1435), mailed on Apr. 22, 2005.

(Continued)

*Primary Examiner* — Rudy Zervigon

(74) *Attorney, Agent, or Firm* — Smith, Gambrell & Russell, LLP

(57) ABSTRACT

A film-forming apparatus of the invention is a film-forming apparatus that includes: a processing container that defines a chamber, a pedestal arranged in the chamber, on which a substrate to be processed can be placed, a showerhead provided opposite to the pedestal, which has a large number of gas-discharging holes, a gas-supplying mechanism that supplies a process gas into the chamber through the showerhead, and a showerhead-temperature controlling unit that controls a temperature of the showerhead.

15 Claims, 15 Drawing Sheets

U.S. PATENT DOCUMENTS

| | | | |
|---|---|---|---|
| 5,698,036 A * | 12/1997 | Ishii et al. | 118/723 MW |
| 5,766,364 A * | 6/1998 | Ishida et al. | 118/725 |
| 5,935,337 A * | 8/1999 | Takeuchi et al. | 118/724 |
| 5,950,925 A * | 9/1999 | Fukunaga et al. | 239/132.3 |
| 6,051,286 A | 4/2000 | Zhao et al. | |
| 6,056,823 A * | 5/2000 | Sajoto et al. | 118/715 |
| 6,063,199 A * | 5/2000 | Sajoto et al. | 118/715 |
| 6,079,356 A | 6/2000 | Umotoy et al. | |
| 6,086,677 A | 7/2000 | Umotoy et al. | |
| 6,106,625 A * | 8/2000 | Koai et al. | 118/715 |
| 6,123,775 A | 9/2000 | Hao et al. | |
| 6,161,500 A * | 12/2000 | Kopacz et al. | 118/723 E |
| 6,183,563 B1 | 2/2001 | Choi et al. | |
| 6,194,037 B1 | 2/2001 | Terasaki et al. | |
| 6,245,192 B1 | 6/2001 | Dhindsa et al. | |
| 6,333,601 B1 | 12/2001 | Wickramanayaka | |
| 6,432,255 B1 | 8/2002 | Sun et al. | |
| 6,450,803 B2 * | 9/2002 | Shirakawa et al. | 432/77 |
| 6,453,992 B1 * | 9/2002 | Kim | 165/206 |
| 6,537,928 B1 * | 3/2003 | Matsuki et al. | 438/788 |
| 6,602,800 B2 * | 8/2003 | Matsuki | 438/778 |
| 6,631,692 B1 | 10/2003 | Matsuki et al. | |
| 6,756,235 B1 * | 6/2004 | Liu et al. | 438/3 |
| 6,772,827 B2 * | 8/2004 | Keller et al. | 165/53 |
| 6,827,815 B2 * | 12/2004 | Hytros et al. | 156/345.33 |
| 6,830,007 B2 * | 12/2004 | Matsuki et al. | 118/723 ER |
| 6,899,786 B2 * | 5/2005 | Senzaki et al. | 156/345.43 |
| 6,901,808 B1 * | 6/2005 | Sharpless et al. | 73/724 |
| 6,921,556 B2 * | 7/2005 | Shimizu et al. | 427/248.1 |
| 7,270,713 B2 * | 9/2007 | Blonigan et al. | 118/715 |
| 7,651,568 B2 * | 1/2010 | Ishizaka et al. | 118/715 |
| 7,661,386 B2 * | 2/2010 | Kasai et al. | 118/666 |
| 2002/0173078 A1 | 11/2002 | Kawano et al. | |
| 2002/0179245 A1 | 12/2002 | Masuda et al. | |
| 2003/0047282 A1 * | 3/2003 | Sago et al. | 156/345.34 |
| 2003/0172872 A1 * | 9/2003 | Thakur et al. | 118/715 |
| 2004/0050492 A1 * | 3/2004 | Tsuei et al. | 156/345.33 |
| 2005/0000423 A1 * | 1/2005 | Kasai et al. | 118/715 |
| 2005/0061445 A1 | 3/2005 | Koshiishi et al. | |
| 2006/0213437 A1 * | 9/2006 | Ishizaka et al. | 118/715 |
| 2006/0213438 A1 * | 9/2006 | Ishizaka et al. | 118/715 |
| 2006/0213617 A1 * | 9/2006 | Fink | 156/345.47 |
| 2006/0225655 A1 * | 10/2006 | Faguet et al. | 118/723 R |
| 2007/0175396 A1 * | 8/2007 | Kasai et al. | 118/723 R |
| 2009/0178614 A1 * | 7/2009 | Kasai et al. | 118/708 |

FOREIGN PATENT DOCUMENTS

| | | |
|---|---|---|
| JP | 9-30893 | 2/1997 |
| JP | 9-87090 | 3/1997 |
| JP | 10-280149 | 10/1998 |
| JP | 11-067693 | 3/1999 |
| JP | 11-302850 | 11/1999 |
| JP | 2000-021853 | 1/2000 |
| JP | 2000-269183 | 9/2000 |
| JP | 2000-269199 | 9/2000 |
| JP | 2000-315658 | 11/2000 |
| JP | 2000-331996 | 11/2000 |
| JP | 2001-021039 | 1/2001 |
| JP | 2003-249455 | 9/2003 |
| KR | 1997-0052776 | 7/1997 |
| KR | 1998-0011808 | 4/1998 |
| KR | 1998-071012 | 10/1998 |
| KR | 1999-0085443 | 12/1999 |
| KR | 2000-0032767 | 6/2000 |
| KR | 2001-0006913 | 1/2001 |
| WO | WO 99/25895 | 5/1999 |
| WO | 99/41766 | 8/1999 |
| WO | WO 99/41426 | 8/1999 |
| WO | 99/53116 | 10/1999 |
| WO | WO 01/07677 A1 | 2/2001 |
| WO | WO01088971 * | 11/2001 |

OTHER PUBLICATIONS

International Preliminary Examination Report (PCT/IPEA/409) (translated) issued for PCT/JP02/01110.

Notification of Transmittal of Translation of the International Preliminary Examination Report (PCT/IB/338) issued for PCT/JP02/01110.

* cited by examiner

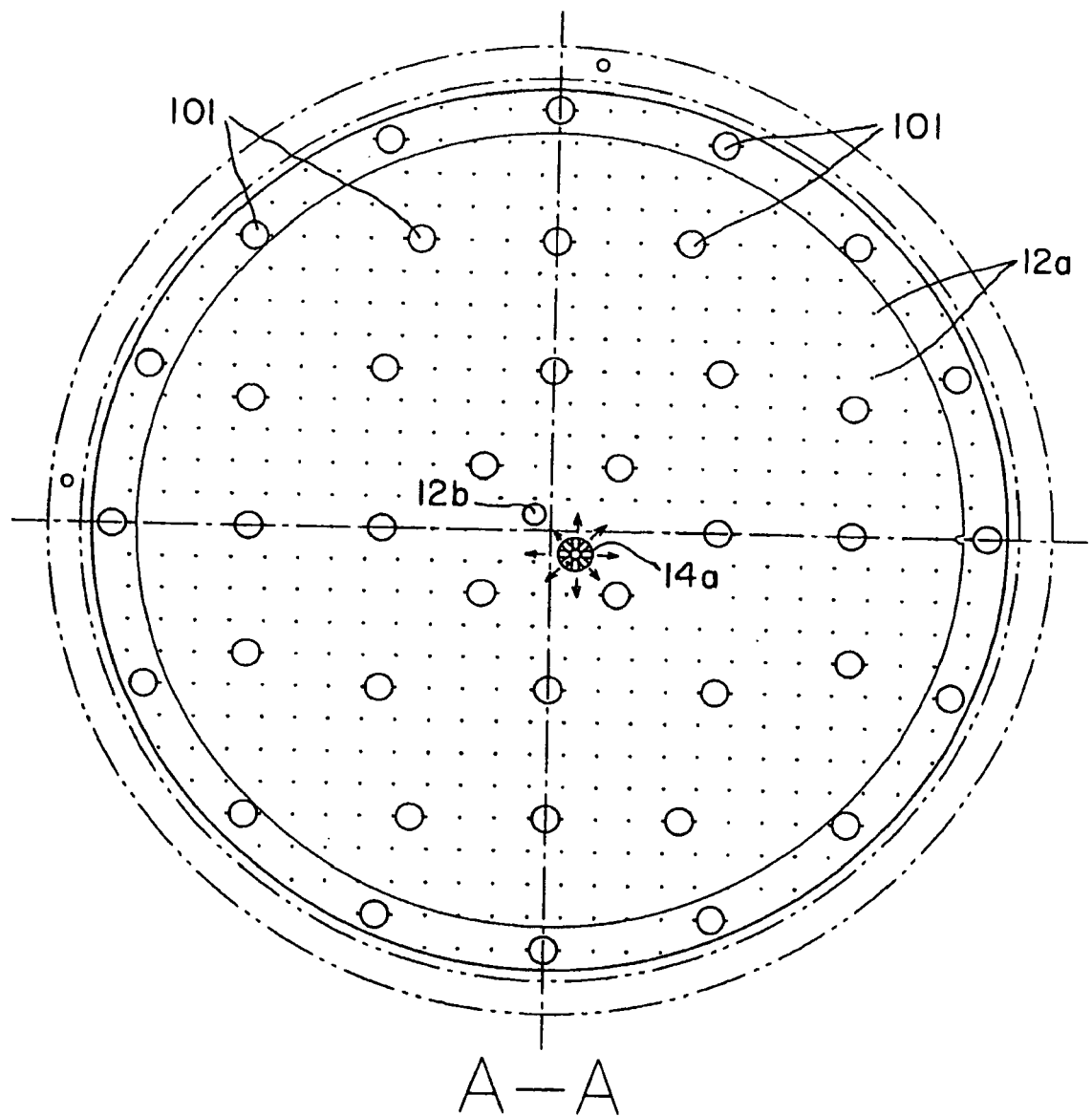
F I G. 8

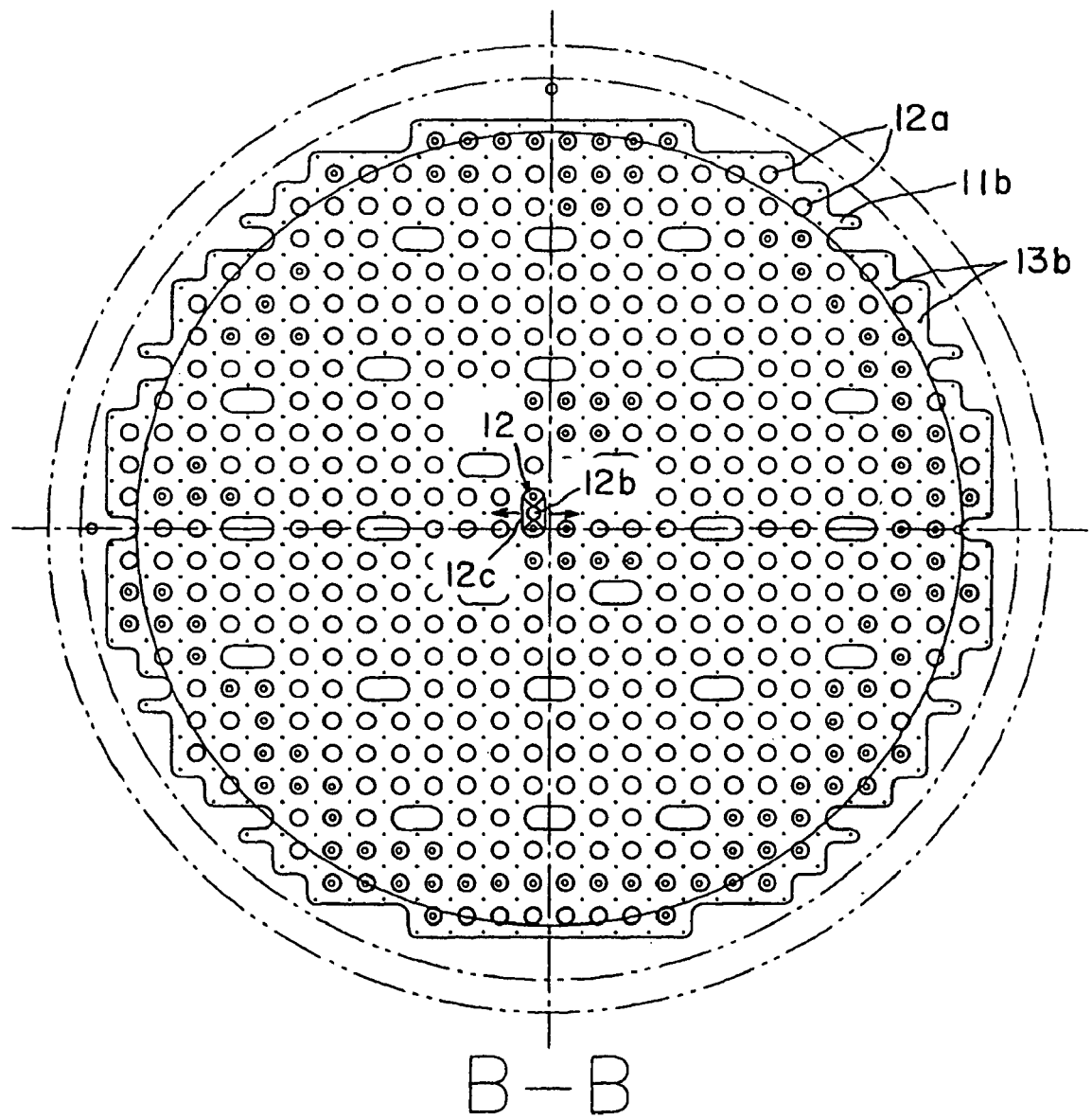
F I G. 9

FILM-FORMING APPARATUS

CROSS REFERENCE TO RELATED APPLICATIONS

This application is a continuation of Ser. No. 11/727,485 filed Mar. 27, 2007, which is a division of Ser. No. 10/467,293, filed Aug. 7, 2003, which is the National Stage of International Application PCT/JP02/01110 filed on Feb. 8, 2002, in the Japanese language, and claims the benefit of JP2001-034520 filed Feb. 9, 2001, which are incorporated herein by reference in their entirely.

FIELD OF THE INVENTION

This invention relates to a film-forming apparatus that forms a predetermined thin film onto a substrate to be processed by means of chemical vapor deposition process (CVD).

BACKGROUND ART

In a semiconductor-device manufacturing process, in order to fill holes between electric wirings formed on a semiconductor wafer as an object to be processed, or in order to provide barrier layers, a metal such as Ti, Al or Cu and/or a metal compound such as WSi, TiN or TiSi is deposited to form a thin film.

Conventionally, such thin film of the metal or metal compound is deposited by means of physical vapor deposition process (PVD). However, recently, it is requested to make devices micro and highly integrated, so that design-rule is especially severe. Thus, it is difficult to obtain sufficient properties by PVD, which is inferior in filling performance. Then, such thin film starts to be deposited by CVD, which we can expect forms a film of better quality.

As a conventional CVD film-forming apparatus, an apparatus for forming a Ti film is explained as an example. In the CVD film-forming apparatus for forming a Ti film, a pedestal, in which a heater is embedded and onto which a semiconductor wafer is placed, is arranged in a chamber having another heater. A showerhead for discharging a process gas is provided above and opposite to the pedestal. The chamber is heated to a predetermined temperature, and the inside of the chamber is vacuumed to a predetermined vacuum level. Then, the semiconductor wafer placed on the pedestal is heated to a predetermined temperature, while the process gas such as $TiCl_4$, $H_2$ and the like is supplied from the showerhead. In addition, a high-frequency electric power is applied to the showerhead, so that the process gas is changed to plasma thereof. Then, the film-forming process is conducted.

However, recently, the semiconductor wafer starts to be enlarged to 300 mm. Thus, the film-forming apparatus has to be enlarged correspondingly. Therefore, the following problems appear manifestly.

When the temperature of the heater embedded in the pedestal rises up, the showerhead provided opposed to the pedestal is heated by radiant heat thereof. However, when the unit is enlarged, the showerhead is also enlarged, that is, heat capacity thereof becomes larger, so that it takes a longer time for the temperature to become stable when the showerhead is heated. That is, the throughput is deteriorated. If the temperature of the showerhead, that is, the surface temperature of the showerhead is not stable during a process, the process is not uniformly conducted. In addition, the conventional showerhead has a structure with high heat-insulating properties, in order to secure temperature stability during a process. Thus, if the showerhead is enlarged, it takes also a longer time to lower the temperature to a predetermined temperature, for example for a cleaning process. If the cleaning process is conducted under a high-temperature state, the showerhead member may be damaged.

In addition, during an idling state, the temperature of the pedestal has to be set higher than that during the process, in order to maintain the temperature of the showerhead at a predetermined temperature. This is explained in detail. Conventionally, during the plasma process, the temperatures of members in the chamber are raised by the plasma. Especially, the surface temperature of the showerhead tends to be raised because it has a large area opposed to the wafer surface and exposed to the plasma. However, when a film-forming process is conducted after an idling state or a cleaning process, it is possible that a film-forming rate for the first wafer is low. It is thought that the reason is that the temperature of the showerhead is low. That is, the temperature thereof is about 500° C. during a normal film-forming process, but it is thought that the temperature falls down by about 20 to 30° C. In order to prevent this, during the idling state or the cleaning process, the temperature of the pedestal had to be set higher than the film-forming temperature.

Furthermore, conventionally, at a maintenance process of the showerhead, an upper lid including the showerhead is opened by a degree not larger than 90 degrees, and then the showerhead is removed or the like. However, as the film-forming apparatus is enlarged, when the showerhead is also bulked or enlarged, it is difficult to conduct the maintenance process of the showerhead in accordance with the conventional method.

SUMMARY OF THE INVENTION

This invention is intended to solve the above problems. The object of this invention is to provide a film-forming apparatus that can lead a showerhead to a predetermined temperature within a short time and wherein temperature stability of the showerhead is high, and to provide a film-forming apparatus wherein maintenance of the showerhead can be easily conducted.

This invention is a film-forming apparatus comprising: a processing container that defines a chamber; a pedestal arranged in the chamber, on which a substrate to be processed can be placed; a showerhead provided opposite to the pedestal, which has a large number of gas-discharging holes; a gas-supplying mechanism that supplies a process gas into the chamber through the showerhead; and a showerhead-temperature controlling unit that controls a temperature of the showerhead.

According to the invention, since the showerhead is provided with the temperature controlling unit, the showerhead can be actively controlled to a desired temperature, when the showerhead is heated. Thus, even if the film-forming apparatus is larger, the temperature of the showerhead can be raised and lowered within a short time. In addition, by actively controlling the temperature of the showerhead, temperature stability of the showerhead can be enhanced.

Furthermore, for example in a case of Ti-film-forming apparatus, when a pre-coated film is formed on the showerhead or the like before a process to the substrate to be processed, or when a Ti film is formed on the substrate to be processed, the film is also formed (deposited) on a surface of the showerhead. At that time, in order to form a stable film on the surface of the showerhead, $TiCl_x$, which is generated by an intermediate reaction, has to be volatilized. Thus, the showerhead has to be heated over 425° C., in particular over 500°

C. In a conventional art, it takes a long time to heat the showerhead, and it is uncertain whether the showerhead is at a desired temperature, so that such a stable film may not be generated. However, by providing the temperature-controlling unit in the showerhead, the showerhead can be controlled to a desired temperature during a film-forming process or a pre-coating process, so that a stable film can be surely formed on the showerhead. Therefore, the first film-forming process can be stably conducted.

Preferably, the processing container is formed in such a manner that the processing container can be vacuumed.

In addition, preferably, the film-forming apparatus further comprises a heating unit that heats the pedestal.

In addition, preferably, the showerhead has: a chamber-inside part that includes a surface in which the large number of gas-discharging holes appear; and an atmosphere-side part that contacts with atmospheric air outside the chamber; and the showerhead-temperature controlling unit is provided in the atmosphere-side part.

In the case, the showerhead-temperature controlling unit can be handled in the atmospheric air.

In addition, preferably, the film-forming apparatus further comprises a second heating unit that heats the chamber.

In addition, preferably, the showerhead-temperature controlling unit includes: a heating mechanism that heats the showerhead; a cooling mechanism that cools the showerhead; a temperature-detecting mechanism that detects a temperature of the showerhead; and a controller that controls at least the heating mechanism, based on a result detected by the temperature-detecting mechanism.

In the case, the showerhead can be rapidly controlled to a desired temperature when the showerhead is both heated and cooled.

In addition, in the case, more preferably, the heating mechanism has: an inside heater that heats an inside portion of the showerhead; and an outside heater that heats an outside portion of the showerhead; and the temperature detecting mechanism has: an inside-temperature detecting part that detects a temperature of the inside portion; and an outside-temperature detecting part that detects a temperature of the outside portion.

In the case, more preferably, the controller is adapted to control the inside heater in such a manner that a value detected by the inside-temperature detecting part coincides with a set temperature, and to control the outside heater in such a manner that a difference between a value detected by the outside-temperature detecting part and the value detected by the inside-temperature detecting part coincides with zero.

In the case, heat dissipation from the outside portion of the showerhead can be inhibited, so that more accurate temperature control can be achieved.

In addition, preferably, a thermal-insulating member is arranged on a surface of the showerhead reverse to the chamber.

In the case, during the process, heat dissipation from the showerhead can be effectively inhibited.

In addition, preferably, the showerhead has: a showerhead body; and a circular supporting part continued upward from on an outside periphery of the showerhead body; and the supporting part has a rib structure.

In the case, since the portion of the supporting part other than the rib structure can be made thin, heat dissipation from the supporting part can be reduced. Thus, temperature controlling performance can be more enhanced.

In the case, more preferably, an insulating member is arranged on the showerhead body and inside the supporting part.

In addition, preferably, a circular infilling member and a fixing member for fixing the infilling member to the showerhead or the processing container are arranged between the showerhead and the processing container.

In the case, more preferably, a resilient member is interposed between the infilling member and the fixing member. In the case, even when quartz, ceramics and so on is used as the infilling member, it can be prevented that the infilling member is damaged. In addition, by means of the resilient member, the interval between the infilling member and the fixing member can be made uniform.

In addition, preferably, the film-forming apparatus further comprises a plasma-generating unit for generating plasma of the process gas in the chamber.

In addition, preferably, the film-forming apparatus further comprises an inverting mechanism that inverts the showerhead by turning the showerhead outwardly from the chamber.

In the case, the showerhead is turned outwardly from the chamber, and thus inverted, so that the showerhead can be taken out from the chamber substantially completely. Thus, maintenance of the showerhead can be conducted very easily.

In addition, this invention is a film-forming apparatus comprising: a processing container that defines a chamber; a pedestal arranged in the chamber, on which a substrate to be processed can be placed; a showerhead provided opposite to the pedestal, which has a large number of gas-discharging holes; a gas-supplying mechanism that supplies a process gas into the chamber through the showerhead; and an inverting mechanism that inverts the showerhead by turning the showerhead outwardly from the chamber.

According to the invention, the showerhead is turned outwardly from the chamber, and thus inverted, so that the showerhead can be taken out from the chamber substantially completely. Thus, maintenance of the showerhead can be conducted very easily.

Preferably, a circular infilling member and a fixing member for fixing the infilling member to the showerhead or the processing container are arranged between the showerhead and the processing container.

In the case, more preferably, a resilient member is interposed between the infilling member and the fixing member. In the case, even when quartz, ceramics and so on is used as the infilling member, it can be prevented that the infilling member is damaged. In addition, by means of the resilient member, the clearance between the infilling member and the fixing member can be made uniform.

More preferably, the fixing member is outwardly removable in a state wherein the showerhead is inverted, and the infilling member is upwardly removable in a state wherein the fixing member has been outwardly removed.

BRIEF DESCRIPTION OF THE DRAWINGS

FIG. 8 is a sectional view taken along A-A line of FIG. 7;

FIG. 9 is a sectional view taken along B-B line of FIG. 7;

DESCRIPTION OF THE PREFERRED EMBODIMENT

Hereinafter, a CVD film-forming apparatus for forming a Ti thin film according to an embodiment of the present invention is explained concretely.

Figure 1:
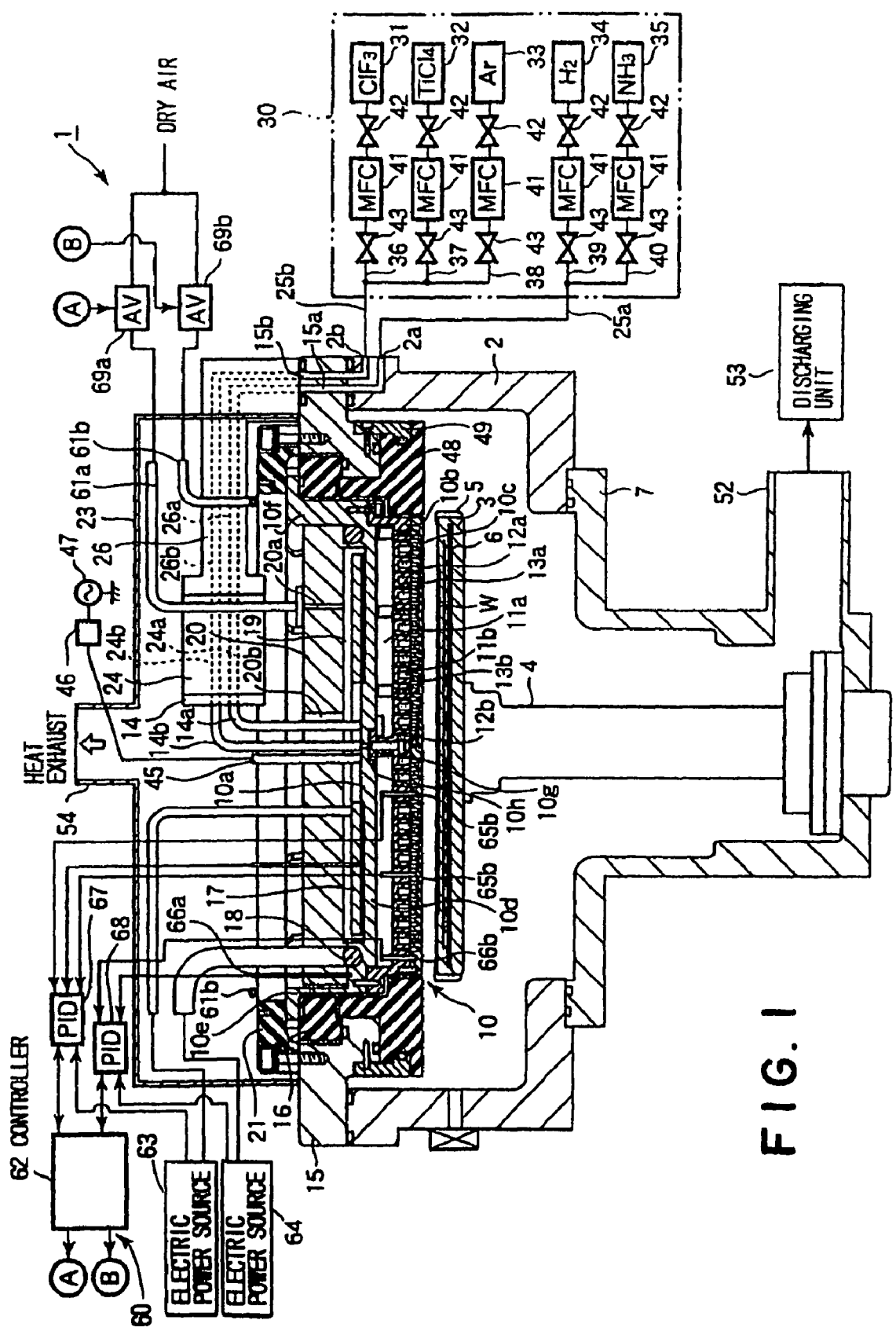
FIG. 1 is a sectional view showing a CVD film-forming apparatus of an embodiment according to the present invention.
Figure 2:
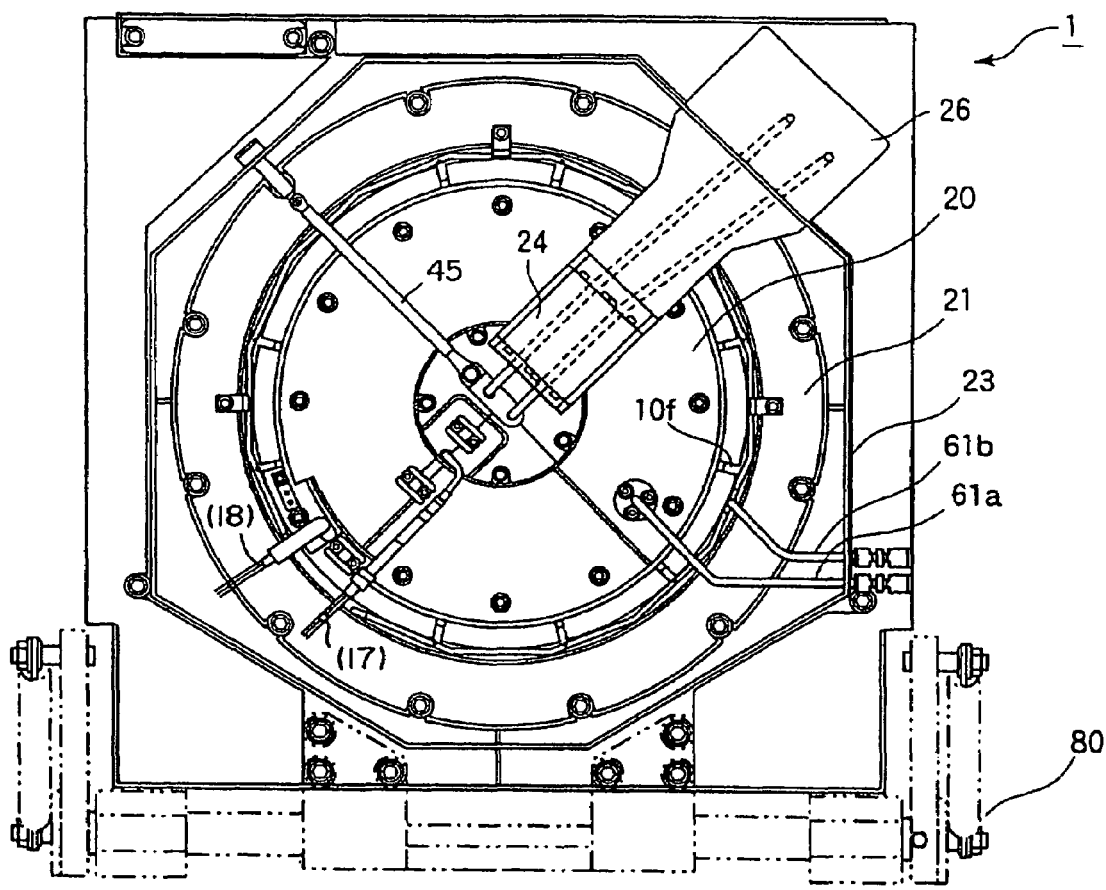
FIG. 2 is a plan view showing an upper portion of the showerhead of the CVD film-forming apparatus of the embodiment according to the present invention.

FIG. 1 is a sectional view showing the CVD film-forming apparatus for forming a Ti thin film according to the embodiment of the present invention. FIG. 2 is a plan view showing an upper portion of a showerhead of the CVD film-forming apparatus of FIG. 1. The film-forming apparatus 1 has a sealed chamber 2 of a substantially cylindrical shape or a box-like shape. A pedestal 3, on which a semiconductor wafer W as an object to be processed is placed horizontally, is provided in the chamber 2. A pedestal supporting member 7 that protrudes downward is attached at a central bottom of the chamber 2 via a sealing ring. A cylindrical supporting member 4 joined to a bottom surface of the pedestal 3 is fixed to the pedestal supporting member 7. The chamber 2 and the pedestal supporting member 7 have heating mechanisms not shown. An electric power source not shown supplies electric power to the heating mechanisms, so that the chamber 2 and the pedestal supporting member 7 are heated to respective predetermined temperatures.

A ring 5 for stabilizing generation of plasma is provided at an outside peripheral portion of the pedestal 3. In addition, a heater 6 is embedded in the pedestal 3. An electric power source not shown supplies electric power to the heater 6, so that the semiconductor wafer W placed on the pedestal 3 as an object to be processed is heated to a predetermined temperature.

A showerhead 10 is arranged opposite to the pedestal 3 at an upper portion of the chamber 2. The showerhead 10 has an upper plate 10a, a middle plate 10b and a lower plate 10c. The plane shape of the showerhead 10 is a circle.

The upper plate 10a has a horizontal portion 10d that forms a showerhead body together with the middle plate 10b and the lower plate 10c, and a circular supporting portion 10e continued upward from on an outside periphery of the horizontal portion 10d. The upper plate 10a is generally concave. As shown in FIGS. 1 and 2, inside the supporting portion 10e, ribs 10f are arranged toward the center of the showerhead 10 at regular distance. As the ribs 10f are formed, while strength against heat deformation of the supporting portion 10e and supporting strength of the supporting portion 10e are enhanced, the other portion of the supporting portion 10e can be made thin. Thus, heat dissipation from the showerhead 10 can be inhibited.

Preferably, each rib 10f protrudes toward the center by 5 mm or more, in particular 10 mm or more. In addition, preferably, a width of each rib 10f is 2 mm or more, in particular 5 mm or more. In addition, preferably, the ribs 10f are arranged at regular distance.

The upper plate 10a serves as a base member. An upper portion of an outside periphery of the circular concave middle plate 10b is fixed to a lower portion of an outside periphery of the horizontal portion 10d of the upper plate 10a by means of screws. An upper surface of the lower plate 10c is fixed to a lower surface of the middle plate 10b by means of screws. A space 11a is hermetically formed between a lower surface of the horizontal portion 10d of the upper plate 10a and an upper surface of the middle plate 10b having a concave portion. A plurality of grooves are formed radially and uniformly in the lower surface of the middle plate 10b. The middle plate 10b and the lower plate 10c are hermetically joined. A space 11b is formed between the plurality of grooves formed in the lower surface of the middle plate 10b and the upper surface of the lower plate 10c. In the middle plate 10b, a large number of first gas-passages 12a, which run from the space 11a toward the lower plate 10c through a plurality of holes formed in the middle plate 10b, and a second gas-passage 12b, which communicates not with the space 11a but with the space 11b, are formed. In the lower plate 10c, a large number of first gas-discharging-holes 13a, which communicate with the first gas-passages 12a, and a large number of second gas-discharging-holes 13b, which communicates with the space 11b, are formed.

Herein, the inside diameter of each first gas-passage 12a formed in the middle plate 10b is for example 0.5 to 3 mm, preferably 1.0 to 2.0 mm. The inside diameter of each first gas-discharging-hole 13a formed in the lower plate 10c has a two-tier structure, wherein the diameter is for example $\phi 1.0$ to 3.5 mm, preferably $\phi 1.2$ to 2.3 mm, at a portion on the side of the space 11a and for example $\phi 0.3$ to 1.0 mm, preferably $\phi 0.5$ to 0.7 mm, at the other portion on the side of the lower opening.

A first gas-introducing-pipe 14a and a second gas-introducing-pipe 14b are connected to an upper surface of the upper plate 10a. The first gas-introducing-pipe 14a communicates with the space 11a. The second gas-introducing-pipe 14b communicates with the second gas-way 12b of the middle plate 10b and the space 11b. Thus, a gas introduced from the first gas-introducing-pipe 14a is discharged out from the first gas-discharging-holes 13a through the space 11a and the first gas-passages 12a. On the other hand, a gas introduced from the second gas-introducing-pipe 14b is introduced into the space 11b through the second gas-passage 12b and then discharged out from the second gas-discharging-holes 13b. That is, the showerhead 10 is a postmix type wherein the gas supplied from the first gas-introducing-pipe 14a and the gas supplied from the second gas-introducing-pipe 14b are independently supplied into the chamber 2. That is, the gas supplied from the first gas-introducing-pipe 14a and the gas supplied from the second gas-introducing-pipe 14b are not mixed in the showerhead 10, and supplied separately.

Figure 7:
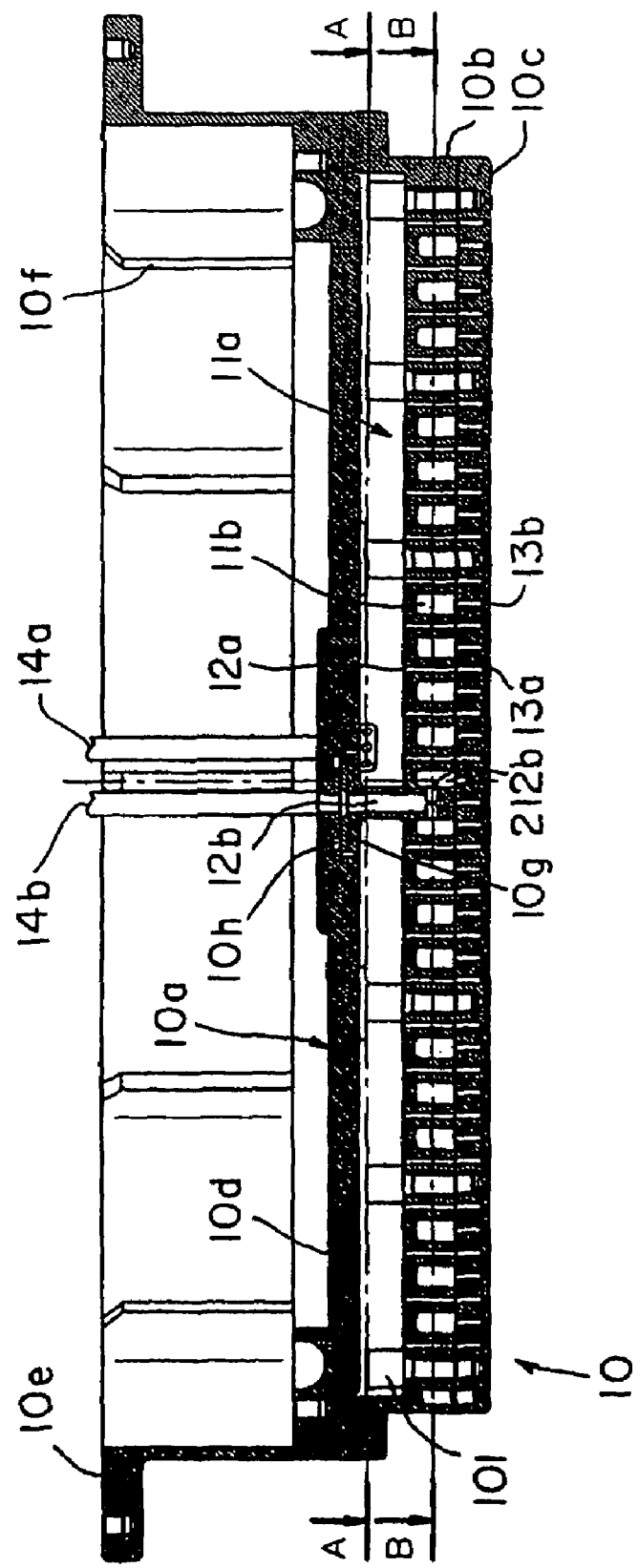
FIG. 7 is an enlarged view of the showerhead of the apparatus of FIG. 1.

Herein, FIG. 7 is an enlarged view of the showerhead of FIG. 1. As shown in FIGS. 1 and 7, a sealing ring 10h can be interposed between a lower surface of a portion of the upper plate 10a surrounding a connecting portion with the second gas-introducing-pipe 14b, which introduces the second process gas, and a flange 10g at a portion of the middle plate 10b forming the second gas-passage 12b. Thus, it can be prevented more surely that the respective gases supplied from the first gas-introducing-pipe 14a and the second gas-introducing-pipe 14b mix with each other.

FIG. 8 is a sectional view taken along A-A line of FIG. 7, and FIG. 9 is a sectional view taken along B-B line of FIG. 7. In FIGS. 7 and 8, a numeral sign 101 indicates bolts. The bolts 101 fasten the middle plate 10b and the lower plate 10c. Arrows in FIG. 9 indicate flow directions of gas supplied from the second gas-passage 12b into the space 11b.

As shown in FIGS. 7 and 9, slits 212b as gas-discharging-holes are formed on right and left sides at a lower end of the second gas-passage 12b. The direction in which the slits 212b are formed may be not only a right and left direction but also a vertical direction or a diagonal direction. Instead of the slits 212b, discharging holes may be formed. The diameter of each discharging hole is preferably 1.0 to 3.0 mm, in particular 2.0 mm. The number of the discharging holes is optional.

On the other hand, as shown in FIG. 1, a flange 14 is commonly welded to respective base ends of the first gas-introducing-pipe 14a and the second gas-introducing-pipe 14b, which are connected to the upper plate 10a. An insulating member 24 including a first gas-passage 24a and a second gas-passage 24b is connected to the flange 14. A gas introducing member 26 including a first gas-passage 26a and a second gas-passage 26b is connected to the other end of the insulating member 24. Then, the gas introducing member 26 is connected to an upper surface of the lid member 15. The lid member 15 and the chamber 2 have, respectively, a first gas-passage 15a, 2a and a second gas-passage 15b, 2b. The first gas-passages 24a, 26a, 15a and 2a and the second gas-passages 24b, 26b, 15b and 2b from the flange 14 to the chamber 2 are, respectively, communicated in series, and sealing rings such as O-rings are interposed at connecting portions thereof. In addition, a first gas pipe 25a is connected to the first gas-passage 2a in the chamber 2, and a second gas pipe 25b is connected to the second gas-passage 2b. And the respective base ends of the gas pipes 25a and 25b are connected to a gas supplying part 30.

The gas supplying part 30 has: a $ClF_3$ gas source 31 that supplies $ClF_3$ gas, which is a cleaning gas; a $TiCl_4$ gas source 32 that supplies $TiCl_4$ gas, which is a film-forming gas; an Ar gas source 33 that supplies Ar gas, which is a carrier gas; a $H_2$ gas source 34 that supplies $H_2$ gas, which is a reduction gas; and a $NH_3$ gas source 35 that supplies $NH_3$ gas, which is used for nitriding a Ti film. The $ClF_3$ gas source 31, the $TiCl_4$ gas source 32 and the Ar gas source 33 are respectively connected to gas pipes 36, 37 and 38. The gas pipes 36, 37 and 38 are connected to the second gas pipe 25b. The $H_2$ gas source 34 and the $NH_3$ gas source 35 are respectively connected to gas pipes 39, 40. The gas pipes 39 and 40 are connected to the first gas pipe 25a.

Thus, the respective gases from the $ClF_3$ gas source 31, the $TiCl_4$ gas source 32 and the Ar gas source 33 arrive in the second gas-passage 12b of the middle plate 10b of the showerhead 10, through the gas pipe 25b, the second gas-passages 2b, 15b, 26b and 24b of the above respective members and the gas-introducing-pipe 14b. Then, the respective gases are introduced into the space 11b, and discharged out from the second gas-discharging-holes 13b of the lower plate 10c.

The respective gases from the $H_2$ gas source 34 and the $NH_3$ gas source 35 are introduced in the space 11a of the showerhead 10, through the gas pipe 25a, the first gas-passages 2a, 15a, 26a and 24a of the above respective members and the gas-introducing-pipe 14a. Then, the respective gases are discharged out from the first gas-discharging-holes 13a of the lower plate 10c through the first gas-passages 12a of the middle plate 10b.

Therefore, during a film-forming process, the $TiCl_4$ gas and the $H_2$ gas are not mixed with each other on the way to be supplied, but mixed after discharged into the chamber 2. Plasma is generated, a predetermined reaction is produced, and a Ti film is deposited on the semiconductor wafer W. A mass-flow controller 41 and a pair of opening/closing valves 42 and 43, between which the mass-flow controller 41 is sandwiched, are provided in each gas pipe 36, 37, 38, 39, 40 from each gas source. The gas supplying part 30 includes an $N_2$ gas source, another pipe, and another opening/closing valve and so on, which are not shown. In addition, for example, the gases supplied into the spaces 11a and 11b may be changed by changing the gas sources connected to the first gas-passage 26a and the second gas-passage 26b, which are formed in the gas introducing member 26.

A lid member 15 having an opening is mounted on an upper side of the chamber 2. A circular insulating member 16 is mounted on an inside peripheral portion of the lid member 15. Then, the supporting portion 10e of the upper plate 10a is supported by the insulating member 16. An upper portion of the supporting portion 10e is covered by a circular insulating member 21 for the purpose of heat insulation. The insulating member 21 is supported by the lid member 15. The insulating member 16 has an effect of electrical insulation between the showerhead 10 and the chamber 2 and an effect of heat (thermal) insulation. Sealing rings such as O-rings are respectively interposed between the chamber 2 and the lid member 15, between the lid member 15 and the insulating member 16, and between the insulating member 16 and the supporting portion 10e. Thus, a sealed state is formed.

Figure 14:
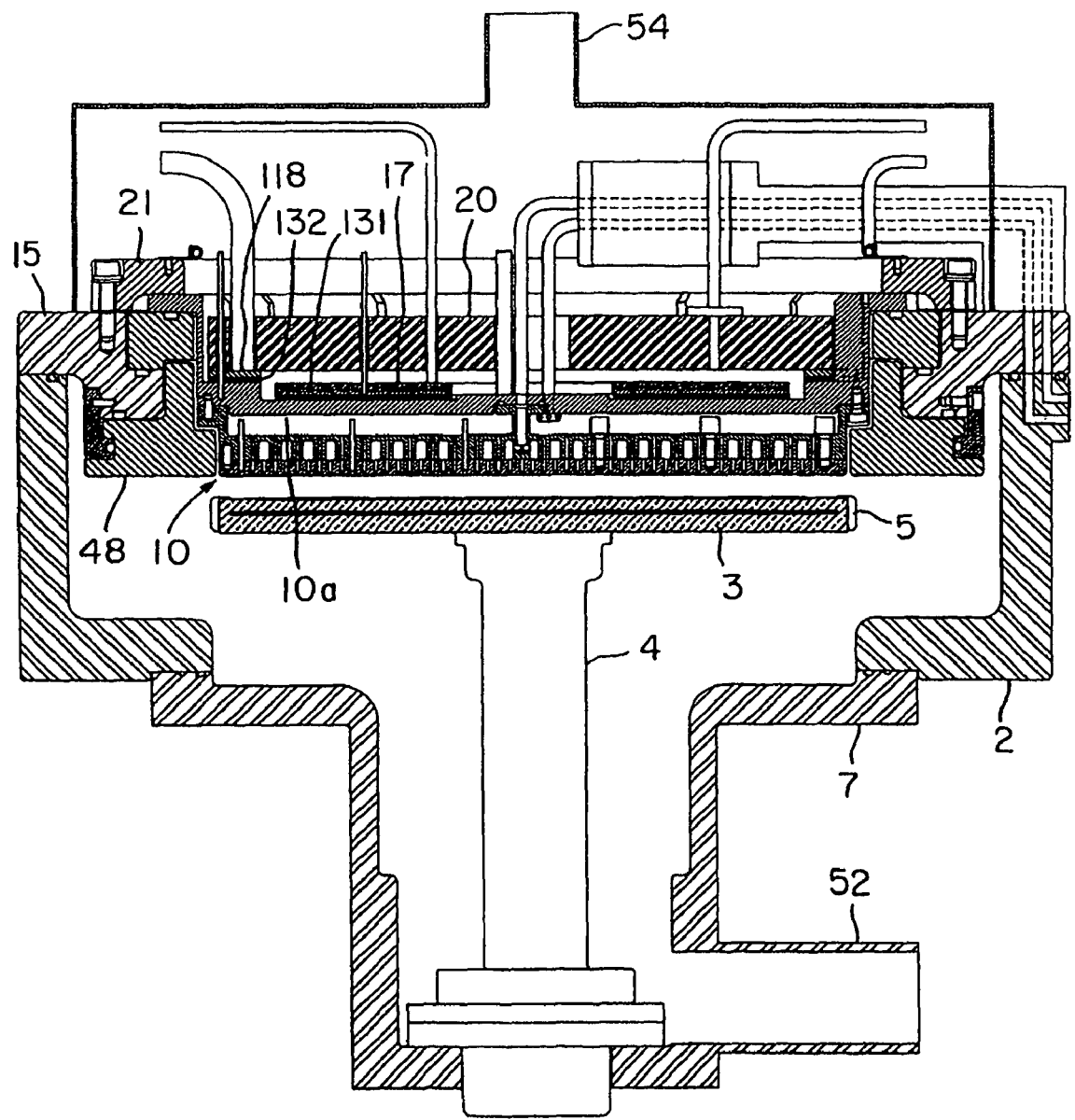
FIG. 14 is a sectional view showing a CVD film-forming apparatus of another embodiment according to the present invention.

An inside heater 17 is arranged on an upper surface of the horizontal portion 10d of the upper plate 10a, correspondingly to the whole surface of the semiconductor wafer W placed on the pedestal 3. For example, the inside heater 17 may be formed by sandwiching a thin plate-like heater member between mica insulating plates. A circular (doughnut-like) outside heater 18, for example a sheath heater, is fitted so as to surround an outside periphery of the inside heater 17. (FIG. 14 shows a structure wherein the same heater as the inside heater 17 is arranged as an outside heater.) These heaters function as elements of a showerhead-temperature controlling unit, which is explained below.

A space 19 is provided above the inside heater 17. A heat insulating member 20 is arranged above the space 19. The heat insulating member 20 may be a ceramics resin such as $Al_2O_3$ or the like. The heat insulating member 20 has a cooling-gas passage 20a and a discharging port 20b. A dry-air supplying pipe 61a for cooling an inside portion is connected to an upper portion of the cooling-gas passage 20a. A dry-air supplying pipe 61b for cooling an outside portion is arranged above the supporting portion 10e of the upper plate 10a. The pipe 61b has a pipe portion 61c along an inside periphery of the insulating member 21. A large number of jetting-holes for jetting out dry air are uniformly and downwardly provided at the pipe portion 61c. The jetted dry air is supplied into a gap between the insulating member 16 and the heat insulating member 20 and its vicinity, so as to cool the outside heater and its vicinity.

A power supply line 45 is connected to an upper surface of the upper plate 10a of the showerhead 10. The power supply line 45 is connected to a high-frequency electric power source 47 via a matching unit 46. Then, a high-frequency electric power is supplied from the high-frequency electric power source 47 to the showerhead 10. Thus, a high-frequency electric field is formed, the process gas supplied into the chamber 2 is made plasma, and the film-forming reaction is promoted.

Figure 3:
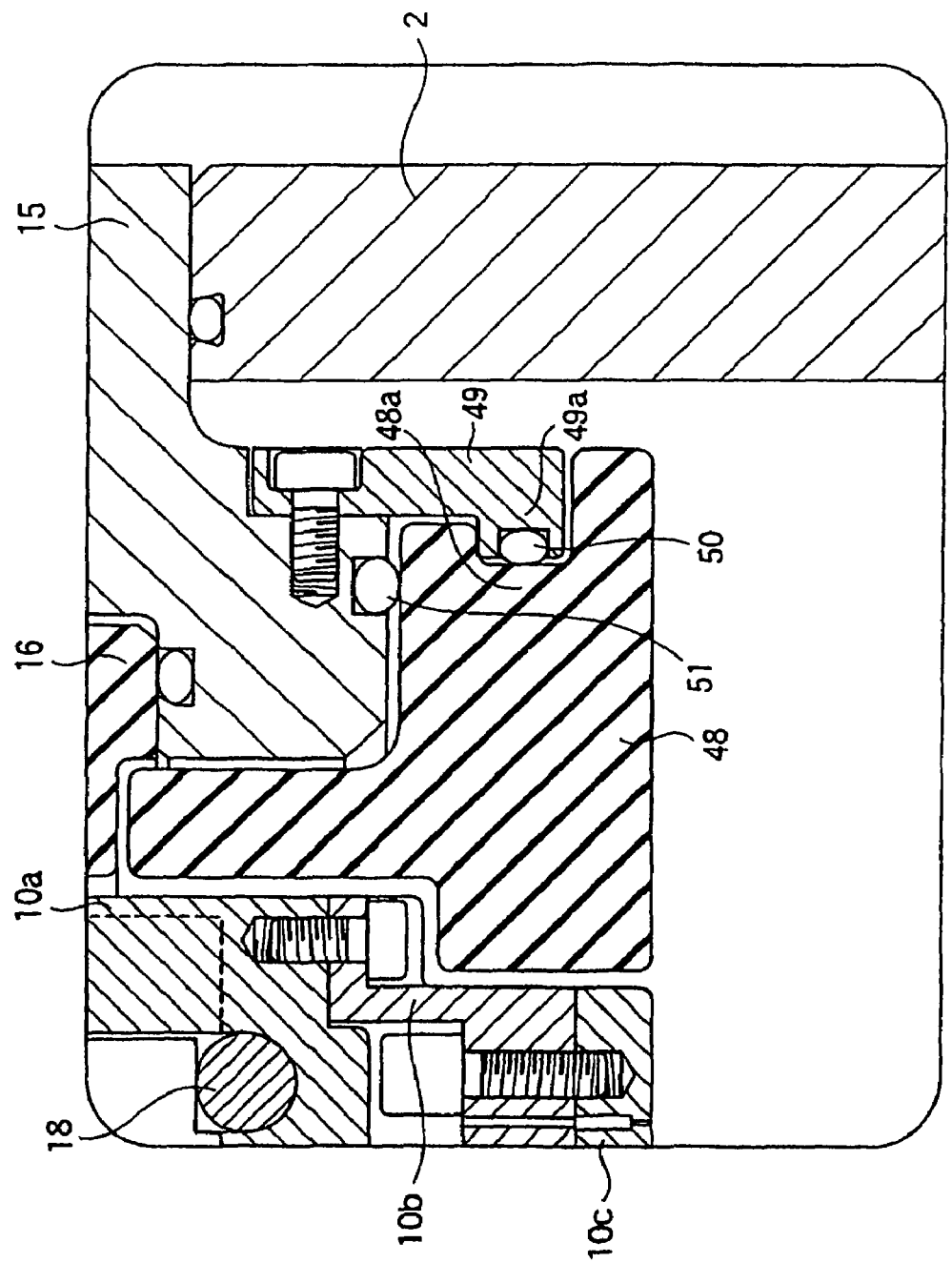
FIG. 3 is an enlarged sectional view showing a filler portion of the apparatus of FIG. 1.

A circular filler (infilling member) 48 made of quartz is provided so as to prevent that plasma is generated around a lower portion of the showerhead 10, especially in a space surrounded by lateral surfaces of the upper plate 10a, the middle plate 10b and the lower plate 10c, a lower surface of the insulating member 16, a lower surface of the lid member 15 and a side wall of the chamber 2. As shown in FIG. 3, the filler 48 has a concave portion 48a at an outside portion thereof. Convex portions 49a of a plurality of supporting members 49 fastened to the lid member 15 by means of screws are fitted in the concave portion 48a to support the filler 48. An elastic (resilient) member 50 such as a fluoro rubber is interposed between a lateral surface of the concave portion 48a of the filler 48 and a lateral surface of each convex portion 49a of each supporting member (fixing member) 49. Because of the elastic member 50, centering of the showerhead 10 can be easily achieved and the filler 48 can be simply attached and removed. In addition, breakage of the filler 48 caused by thermal expansion and contraction can be prevented. An elastic (resilient) member 51 is interposed between the filler 48 and the lid member 15. The elastic member 51 also has a function of preventing the breakage of the filler 48.

An exhaust pipe 52 is connected to a side wall at a base portion of the cylindrical pedestal supporting member 7 attached at a base portion of the chamber 2. An exhaust unit 53 is connected to the exhausting pipe 52. Thus, the chamber 2 can be evacuated. A unit that traps unreacted materials and/or by-products is not shown but provided on an upstream side with respect to the exhausting unit 53. The chamber 2 can be vacuumed to a predetermined vacuum level by driving the exhausting unit 53. In addition, a sealed box 23 is provided over the lid member 15. An exhausting port 54 is provided at an upper portion of the sealed box 23. Inside heated dry air and outside heated dry air in the sealed box 23 are adapted to be exhausted from the exhausting port 54.

The CVD film-forming apparatus 1 according to the embodiment has a showerhead-temperature controlling unit 60 that controls a temperature of the showerhead 10. The showerhead-temperature controlling unit 60 is explained hereinafter.

As main elements, the showerhead-temperature controlling unit 60 has: the inside heater 17 and the outside heater 18, which are described above as a heating mechanism; the dry-air supplying pipes 61a and 61b for supplying dry air as a cooling mechanism; a temperature-detecting mechanism consisting of thermocouples 65a, 65b, 66a and 66b that monitor temperatures of the inside heater 17, the outside heater 18 and the lower plate 10d of the showerhead 10; and a controller 62 that controls the above elements.

Figure 4:
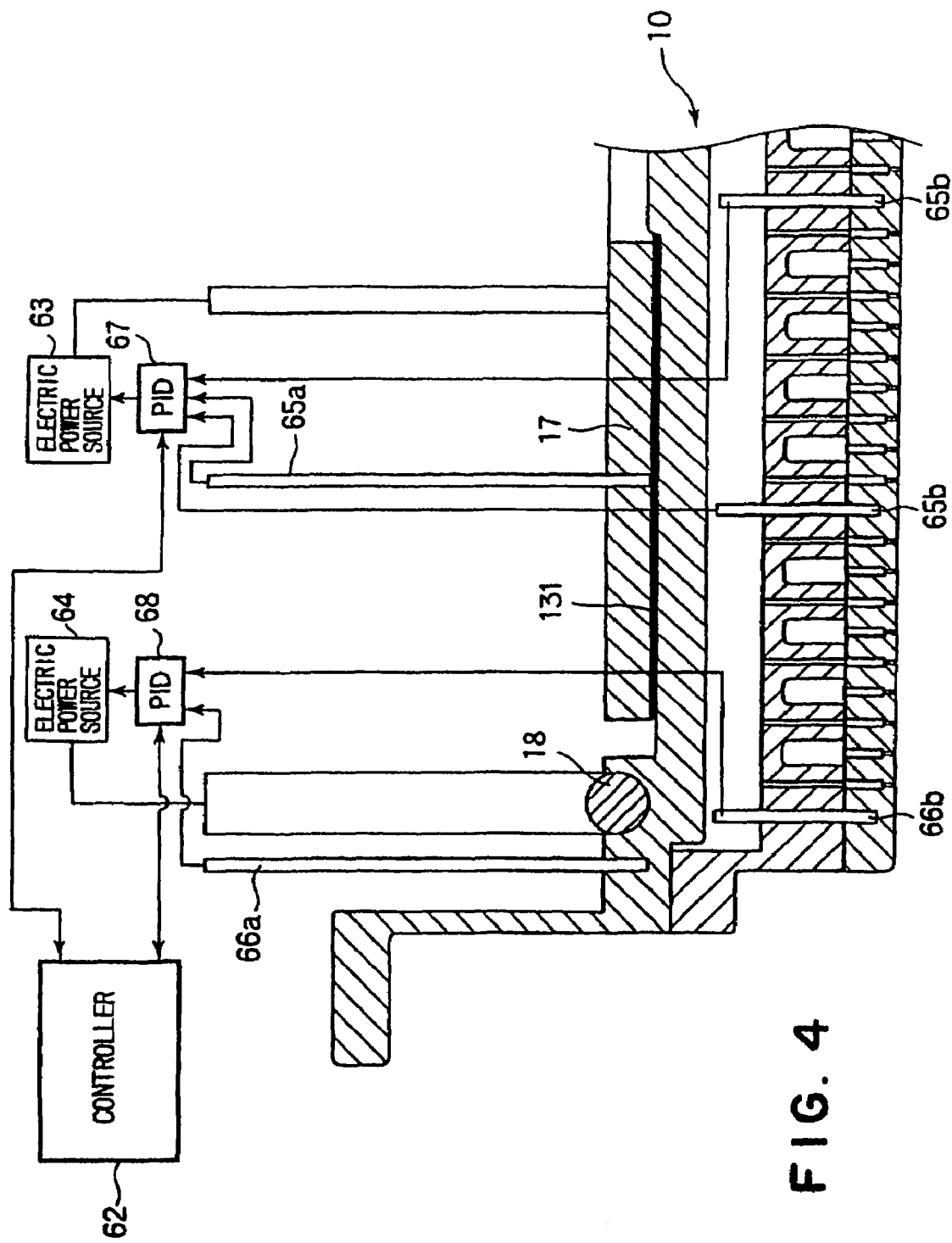
FIG. 4 is a schematic view showing a portion corresponding to a heating mechanism in a temperature-controlling unit of the apparatus of FIG. 1.

As enlargedly shown in FIG. 4, an electric power source 63 is connected to the inside heater 17, and an electric power source 64 is connected to the outside heater 18. At a position corresponding to the inside heater 17 arranged at the inside portion on the upper plate 10a of the showerhead 10, the thermocouple 65a for detecting the temperature contacts with an insulating sheet 131 of high thermal conductivity on the upper plate, and the thermocouple 65b contacts with the inside of the lower plate. At a position corresponding to the outside heater 18 arranged at the outside portion on the upper plate 10a, the thermocouple 66a for detecting the temperature of the outside portion of the upper plate 10a contacts with the inside of the upper plate and the thermocouple 66b for detecting the temperature of the outside portion of the lower plate 10c contacts with the inside of the lower plate. Each thermocouple 65a, 65b, 66a, 66b may be a plurality of thermocouples. In addition, provided is an inside-temperature controller 67 that controls the temperature by means of a PID control to the output of the inside heater 17, based on an instruction of the controller 62 and a signal detected by the thermocouple 65a or 65b, and provided is an outside-temperature controller 68 that controls the temperature by means of a PID control to the output of the outside heater 18 or the like, based on an instruction of the controller 62 and a signal detected by the thermocouple 66a or 66b. Thus, when the showerhead 10 is heated, temperature control of the showerhead 10 can be achieved by the temperature controllers 67 and 68.

On the other hand, the dry air supplied from the dry-air supplying pipe 61a is introduced into the space 19 through the cooling-gas passage 20a of the heat insulating member 20, as a cooling material. The dry air takes heat emitted from the inside heater 17 into the space 19, flows through the exhausting port 20b, and is exhausted from the exhausting port 54 of the sealed box 23 provided on the upper portion of the lid member 15. The dry air supplied from the dry-air supplying pipe 61b is discharged out from the discharging-holes on the lower side of the pipe, takes heat in the outside portion of the showerhead including the outside heater 18 or the like, and is exhausted from the exhausting port 54 of the sealed box 23. Air operation valves 69a and 69b are respectively provided in the dry-air supplying pipes 61a and 61b. The air operation valves 69a and 69b are controlled by the controller 62.

Figure 5:
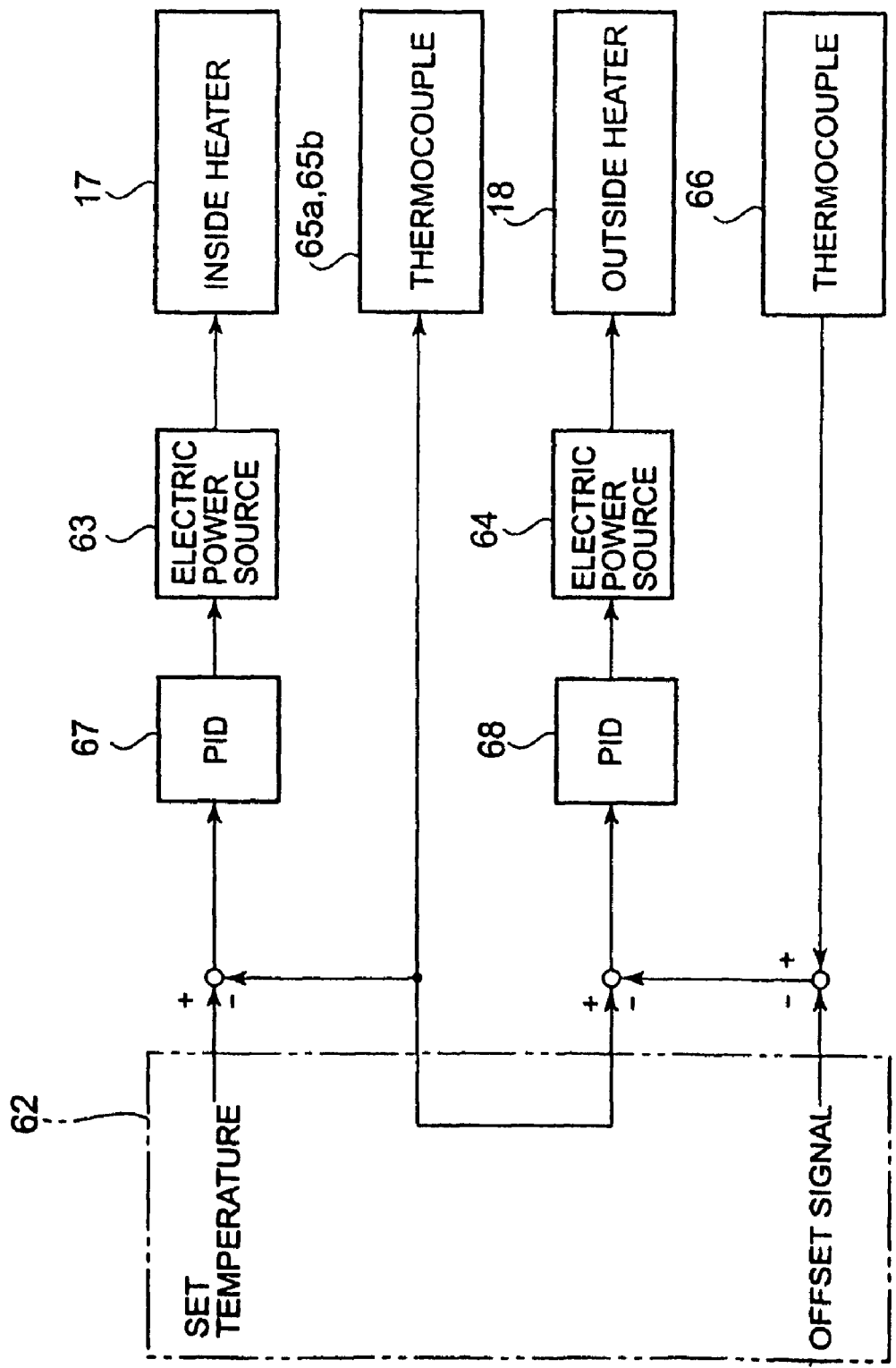
FIG. 5 is a schematic view showing a preferable control manner in heating and controlling by means of the temperature-controlling unit of the apparatus of FIG. 1.

When the showerhead is heated while the showerhead controlling unit 60 is used, a preferable temperature control can be achieved in accordance with a control shown in FIG. 5. In the control shown in FIG. 5, a set temperature is set at the controller 62. Then, the temperature controller 67 controls the output of the inside heater 17 in such a manner that a temperature detected by the thermocouple 65a or 65b coincides with the set temperature. The value detected by the thermocouple 65a or 65b is also outputted to the temperature controller 68 via the controller 62. Then, the temperature controller 68 controls the output of the outside heater 18 in such a manner that the difference between a temperature detected by the thermocouple 66a or 66b at the position corresponding to the outside heater 18 and a temperature detected by the thermocouple 65a or 65b at the position corresponding to the inside heater 17 coincides with zero. Therefore, the temperature of the outside portion of the showerhead 10 and the temperature of the inside portion of the showerhead 10 are controlled to be substantially the same.

The upper surface of the upper plate 10a of the showerhead 10 and a portion above it are exposed to atmospheric air. The thermocouples 65b and 66b of the showerhead-temperature controlling unit 60 are arranged in the showerhead, which can be a vacuum. However, the other elements are arranged in the atmospheric air.

Figure 6:
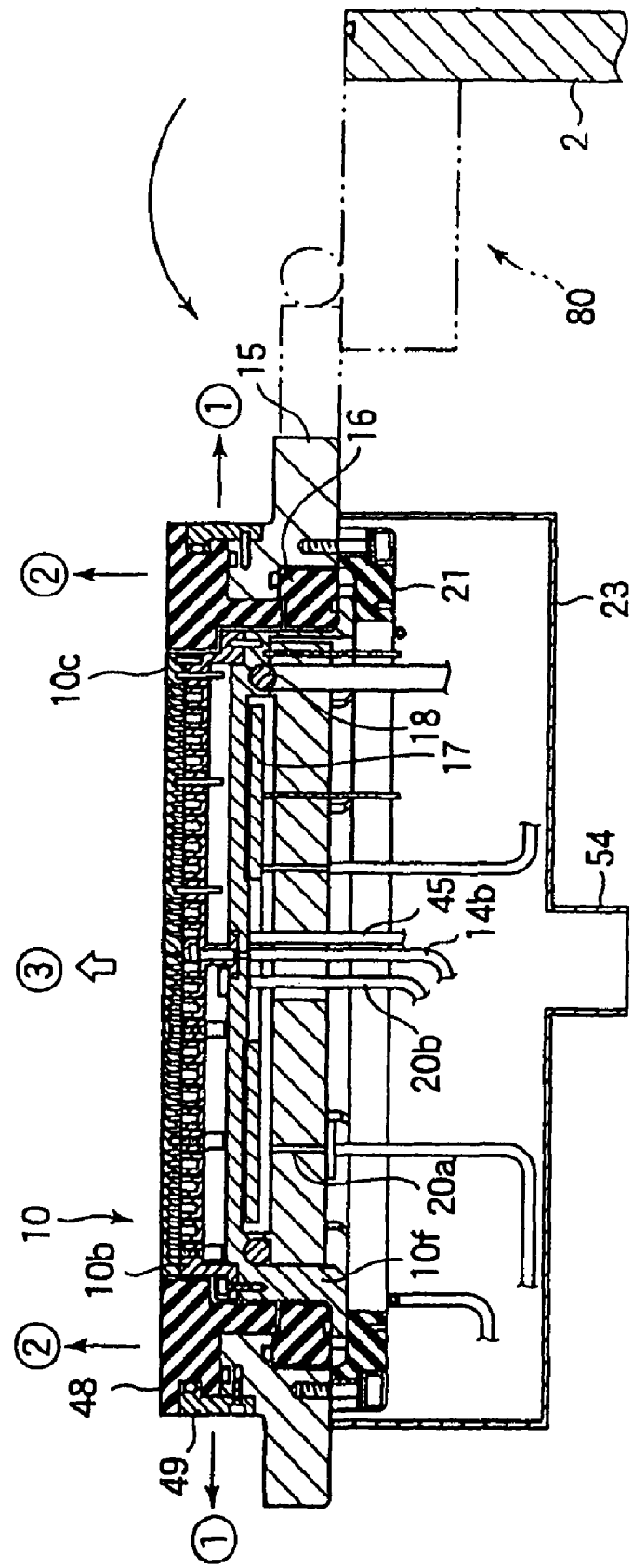
FIG. 6 is a sectional view showing a state wherein a showerhead of the apparatus of FIG. 1 is inverted by an inverting mechanism.

In addition, as shown in FIG. 2, the showerhead 10 can be inverted outwardly from the chamber 2 by an inverting mechanism 80 having a hinge mechanism. Thus, as shown in FIG. 6, the showerhead 10 can be positioned substantially completely outside the chamber 2 in such a manner that the gas-discharging surface is directed upward. Thus, maintenance of the showerhead 10 can be very easily conducted. Concretely, from the state shown in FIG. 6, the plurality of supporting members 49 can be easily taken out outwardly by removing the fastening screws (arrow (1)). After the supporting members 49 are taken out, the filler 48 can be easily taken out upwardly (arrow (2)). Then, after the filler 48 is taken out, maintenance of the showerhead 10 itself can be conducted. For example, the lower plate 10c and the middle plate 10b can be easily taken out upwardly (arrow (3)). After the showerhead 10 is inverted, it is preferable that the showerhead 10 is held at a position inverted by 180 degrees. It is sufficient that the inverted degrees are around 180 degrees. In order to hold the showerhead 10 at such position, a gas spring or the like can be used.

Next, a processing operation of the CVD film-forming apparatus 1 as structured above is explained. At first, before a Ti thin film is formed on a semiconductor wafer W, a precoated film is formed on the surfaces of the showerhead 10 and the pedestal 3 and so on in accordance with the following steps. First, environs of the chamber 2, the heater 6 of the pedestal 3, and the inside and outside heaters 17 and 18 of the showerhead 10 are heated. Then, the chamber 2 is exhausted by the discharging unit 53, a predetermined gas is introduced into the chamber 2 at a predetermined flow rate, and the inside of the chamber 2 becomes a predetermined pressure. Then, a film-forming gas, which includes $H_2$ gas, $Ticl_4$ gas and other gases, is introduced into the chamber 2 at a predetermined flow rate, and a high-frequency electric power is supplied from the high-frequency electric power source 47 to the showerhead 10, so that plasma is generated in the chamber 2. Thus, a Ti film is deposited on the showerhead 10 and the pedestal 3 and so on. Then, the supply of the electric power from the high-frequency electric power source 47 and the supply of the $TiCl_4$ gas are stopped. Then, $NH_3$ gas and other gases are supplied at predetermined flow rates, and again the high-frequency electric power is supplied from the high-frequency electric power source 47 to the showerhead 10, so that plasma is generated. Thus, a surface of the deposited Ti film is nitrided, so that a stable pre-coated film is formed on the showerhead 10 and pedestal 3 and so on. After the nitriding process is completed, the supply of the electric power from the high-frequency electric power source 47 and the supply of the $NH_3$ gas are stopped.

After the pre-coating process is completed, a gate valve not shown is opened, and a semiconductor wafer W is conveyed into the chamber 2 and placed onto the pedestal 3. Then, the $H_2$ gas, the $TiCl_4$ gas and the other gases are supplied at predetermined flow rates, and a high-frequency electric power is supplied from the high-frequency electric power source 47 to the showerhead 10, so that plasma is generated in the chamber 2. Thus, a Ti film is deposited on the semiconductor wafer W. Then, the supply of the electric power from the high-frequency electric power source 47 and the supply of the $TiCl_4$ gas are stopped. Then, the $NH_3$ gas and the other gases are supplied at predetermined flow rates, and again the high-frequency electric power is supplied from the high-frequency electric power source 47 to the showerhead 10, so that plasma is generated. Thus, the Ti film deposited on the semiconductor wafer W is nitrided. After the nitriding process is completed, the supply of the electric power from the high-frequency electric power source 47 and the supply of the $NH_3$ gas are stopped. After the film-forming process is completed as described above, the processed semiconductor wafer W is conveyed out from the chamber 2, another semiconductor wafer W to be successively processed is conveyed into the chamber, and the same film-forming process is conducted to the latter semiconductor wafer W.

After the film-forming process is conducted to a predetermined number of semiconductor wafers W, the pedestal 3 and the showerhead 10 are cooled to a predetermined temperature, and $ClF_3$ gas as a cleaning gas is supplied into the chamber 2 in order to conduct a cleaning process.

In the series of processes, in accordance with the embodiment, the following effects can be achieved because the showerhead 10 is provided with the showerhead-temperature controlling unit 60.

In the pre-coating process and the film-forming process, unreacted products $TiCl_x$ (x=1, 2, 3) may be formed. The $TiCl_x$ has to be volatilized in order to form a stable film on the showerhead. For that purpose, a temperature not lower than 425 C.°, preferably not lower than 500° C., is necessary. As the conventional showerhead is passively heated by the heater in the pedestal, there is no certification of that the conventional showerhead is heated to or over 425° C. Thus, conventionally, there were possibilities that a stable pre-coated film may not be formed on the showerhead. However, in the embodiment, the showerhead 10 is provided with the showerhead-temperature controlling unit 60, so that the showerhead 10 can be actively heated to or over 425° C. In addition, by supplying a gas including the $NH_3$ gas so as to reduce and nitride $TiCl_x$, a stable pre-coated film can be surely formed on the showerhead 10.

In addition, when the inside of the chamber 2 is heated to a film-forming temperature, if the showerhead 10 is heated only by radiant heat from the pedestal 3 like a conventional manner, it takes a long time for the temperature of the showerhead 10 to become stable at a predetermined heating temperature. However, according to the embodiment, in addition to being passively heated by the heater 6 of the pedestal 3, the showerhead 10 is in advance actively heated by the heaters 17 and 18 that are elements of the showerhead-temperature controlling unit 60. Thus, within a shorter time, the whole showerhead 10 is heated, so that the temperature of a surface of the lower plate of the showerhead 10 can be stabilized to a constant temperature. Thus, the temperature in the chamber 2 can be stabilized to a predetermined temperature within a short time. As described above, as the temperature of the showerhead 10 is controlled uniformly, the Ti film can be formed uniformly on the semiconductor wafer W. Especially, when a semiconductor wafer is enlarged to 300 mm and thus the apparatus is also enlarged, the above effect is remarkable.

During an idling state, the high-frequency electric power source is turned off. Thus, conventionally, in order to maintain the temperature of the showerhead 10 at a predetermined temperature, the temperature of the heater in the pedestal was set higher. On the other hand, according to the embodiment, as the temperature of the showerhead 10 is controlled by the showerhead-temperature controlling unit 60, the temperature of the showerhead 10 can be maintained and stabilized at a predetermined temperature, even during an idling state.

For a cleaning process, the temperature of the showerhead 10 has to be lowered from the film-forming temperature to a cleaning temperature of 200 to 300° C. Conventionally, heat-radiating performance of the showerhead was so poor that it took a long time for the temperature to fall down. However, according to the embodiment, dry air as a cooling medium is supplied to the upper portion of the showerhead 10 through the dry-air supplying pipes 61a and 61b by the showerhead-temperature controlling unit 60, in order to cool the showerhead. Thus, the inside temperature of the chamber 2 can be fast lowered to a cleaning temperature.

In the unit of the embodiment, the upper part of the upper plate 10a of the showerhead 10 is exposed to atmospheric air. Thus, almost all the elements of the showerhead-temperature controlling unit 60 can be disposed inside atmosphere. Therefore, it is easy to handle the showerhead-temperature controlling unit 60.

In addition, in the embodiment, the inside heater 17 and the outside heater 18 are provided as a heating mechanism of the showerhead-temperature controlling unit 60, in order to achieve a two-zone control. Then, as shown in FIG. 4, the output of the inside heater 17 is controlled by the temperature controller 67 in such a manner that a temperature detected by the thermocouple 65a or 65b coincides with a set temperature, and the output of the outside heater 18 is controlled by the temperature controller 68 in such a manner that the difference between a temperature detected by the thermocouple 66a or 66b located correspondingly to the outside heater 18 and the temperature detected by the thermocouple 65a or 65b located correspondingly to the inside heater 17 coincides with zero, so that the inside portion and the outside portion of the showerhead 10 are controlled to be always at the same temperature. Thus, heat dissipation from the outside portion of the showerhead 10 can be inhibited, so that temperature controlling performance can be enhanced. Especially, when the size of a semiconductor wafer is enlarged to 300 mm, as heat tends to be dissipated from the outside portion of the showerhead 10, the above two-zone control is more effective.

At the maintenance of the showerhead 10, the showerhead 10 is inverted outwardly from the chamber 2 by the inverting mechanism 8. Thus, as shown in FIG. 6, the maintenance of the showerhead 10 can be conducted while the gas-discharging surface of the showerhead 10 is directed upward. That is, the maintenance of the showerhead 10 can be conducted very easily. Concretely, from the state shown in FIG. 6, the plurality of supporting members 49 are taken out outwardly. Then, the filler 48 is taken out upwardly. Then, the lower plate 10c and the middle plate 10b of the showerhead 10 are taken out upwardly. As described above, each operation for taking-out each element is so easy that the maintenance of the showerhead 10 can be conducted very easily.

This invention is not limited to the above embodiment, but may be variably modified within a scope of spirit of the invention. For example, although the film-forming process of a Ti film is explained in the above embodiment, this invention is not limited thereto, but applicable to a CVD film-forming process of another film such as a TiN film. In addition, although the case wherein the plasma is generated is explained, the plasma is not necessary. The showerhead-temperature controlling unit is also not limited to the above structure. The controlling method is also not limited to the above method. For example, although the dry air is used as a cooling medium, another gas such as Ar or $N_2$ can be also used. If plasma is not used, liquid such as water or coolant can be used as a cooling medium. In addition, although the process to the semiconductor wafer is explained, this invention is not limited thereto, but also applicable to a process to another substrate such as a Liquid-Crystal-Display glass substrate.

Next, a variant of the above embodiment is explained in detail.

As shown in FIG. 9, in the above embodiment, the second gas-supplying portion 12 communicating with the second gas-passage 12b is arranged in the substantially central portion of the space 11b formed below the middle plate. The openings 12c are formed on the lateral sides of the gas-supplying portion 12. Thus, the gas supplied through the second gas-passage 12b, which communicates with the second gas-supplying pipe 14b and is formed above the middle plate, is discharged from the openings 12c of the gas-discharging portion 12 and directly diffused into the space 11b.

However, according to that manner, the gas supplied through the second gas-passage 12b may not be sufficiently uniformly diffused into the space 11b of the middle plate 10c.

Then, it is preferable that one or more gas-diffusion promoting pipes are connected to the openings 12c of the second gas-discharging portion 12 arranged in the substantially central portion of the space 11b.

In the case of the middle plate 10c shown in FIG. 10, a substantially H-shaped gas-diffusion promoting pipe 110 is arranged in the space 11b below the middle plate 10c in order to uniformly diffuse the second gas. The central portion of the substantially H-shaped gas-diffusion promoting pipe 110 is connected to and fitted in the second gas-discharging portion 12. Gas-discharging holes 110a are formed at four tip portions of the gas-diffusion promoting pipe 110. The gas-diffusion promoting pipe 110 is formed integratedly by welding. Supporting pillars 110b that supports the gas-diffusion promoting pipe 110 are fixed to the middle plate 10b and the upper surface of the lower plate 10c, in order to prevent motion of the gas-diffusion promoting pipe 110.

In this case, the gas-discharging holes 110a formed at the respective tip portions are open toward the upper plate, so that the gas supplied through the second gas-discharging portion 12 can be sufficiently uniformly diffused into the space 11b. Arrows in FIG. 10 schematically show flows of the gas supplied from the gas-discharging holes 110a into the space 11b. The shape, the orientation and the position of the gas-diffusion promoting pipe 110, the number of gas-discharging holes 110a and the manner of openings are not limited, if the gas supplied through the second gas-passage 12b can be diffused sufficiently uniformly into the space 11b. For example, the gas-discharging holes 110a may be formed to open to a lateral direction. The gas-discharging holes 110a may be formed uniformly on the way to the tip ends of the pipe, preferably uniformly in the space 11b.

Figure 10:
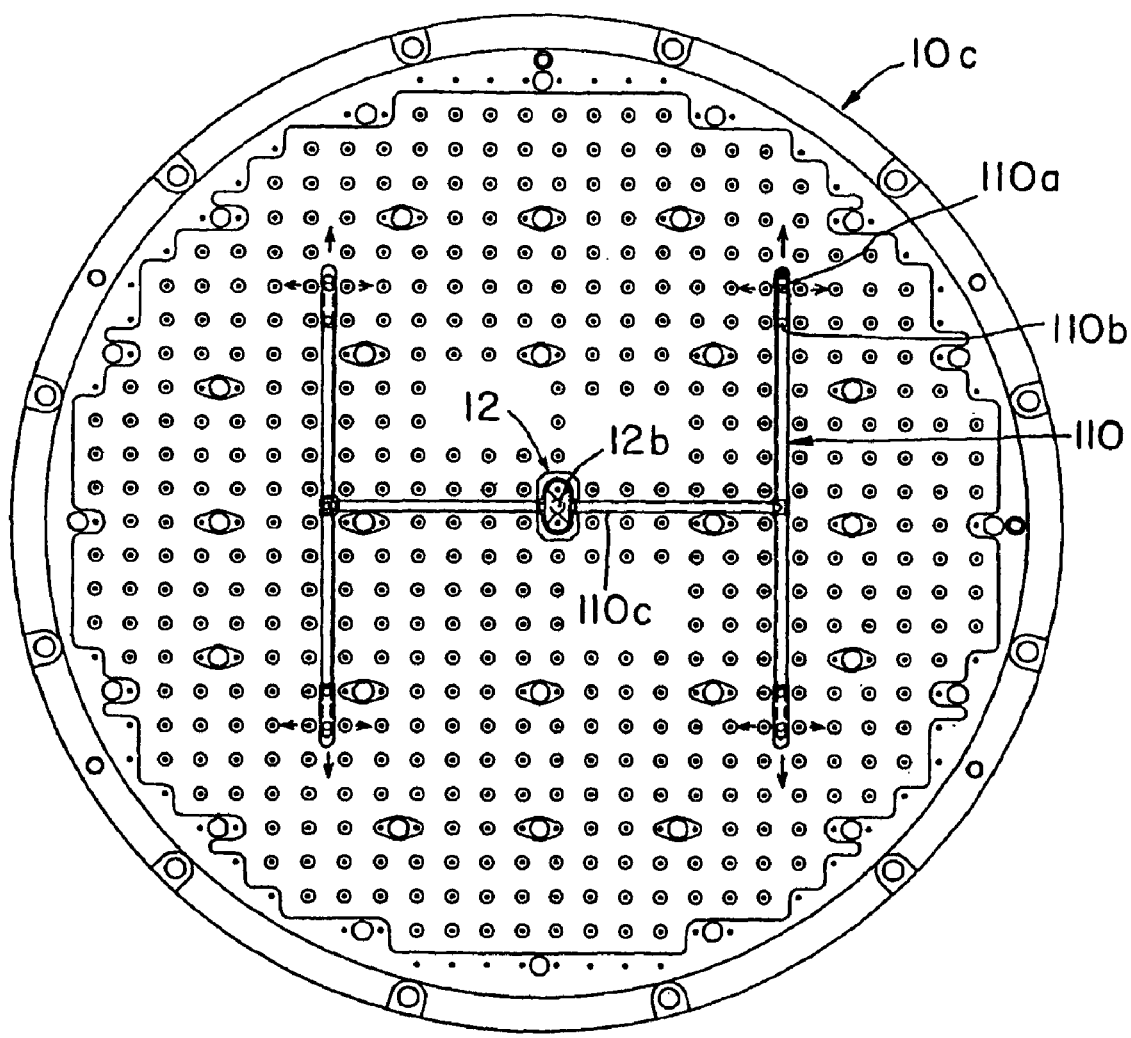
FIG. 10 is a plan view showing a lower plate wherein a gas-diffusion-promoting pipe is provided.
Figure 11:
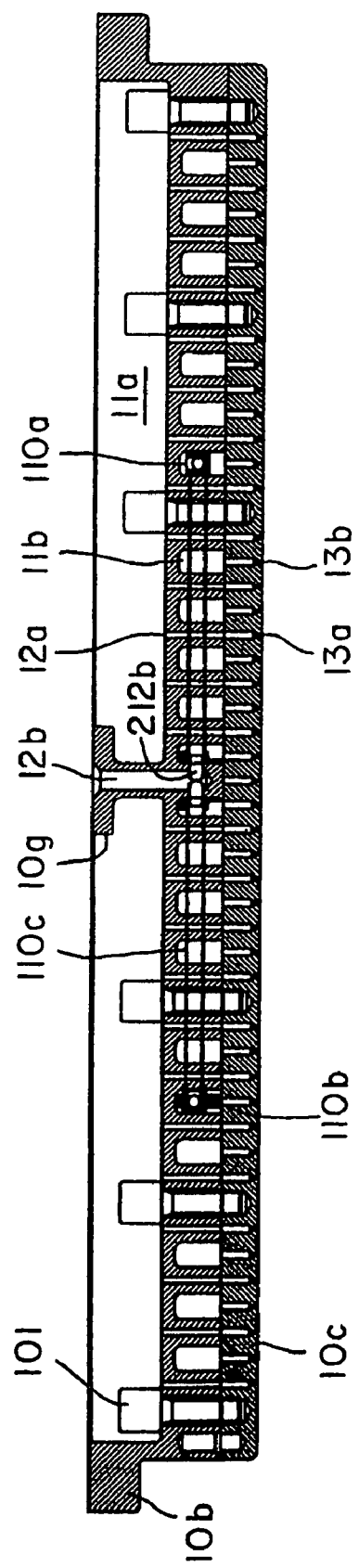
FIG. 11 is a sectional view of the lower plate and a middle plate wherein the gas-diffusion-promoting pipe of FIG. 10 is attached.

FIG. 11 shows a sectional view of the middle plate 10b attached to the lower plate 10c and the gas-diffusion promoting pipe 110 shown in FIG. 10. FIG. 11 shows a section piercing a central pipe 110c of the gas-diffusion promoting pipe 110 basically, but shows a section piercing a gas-discharging hole 110a at a right-end portion of the gas-diffusion promoting pipe 110.

Figure 12:
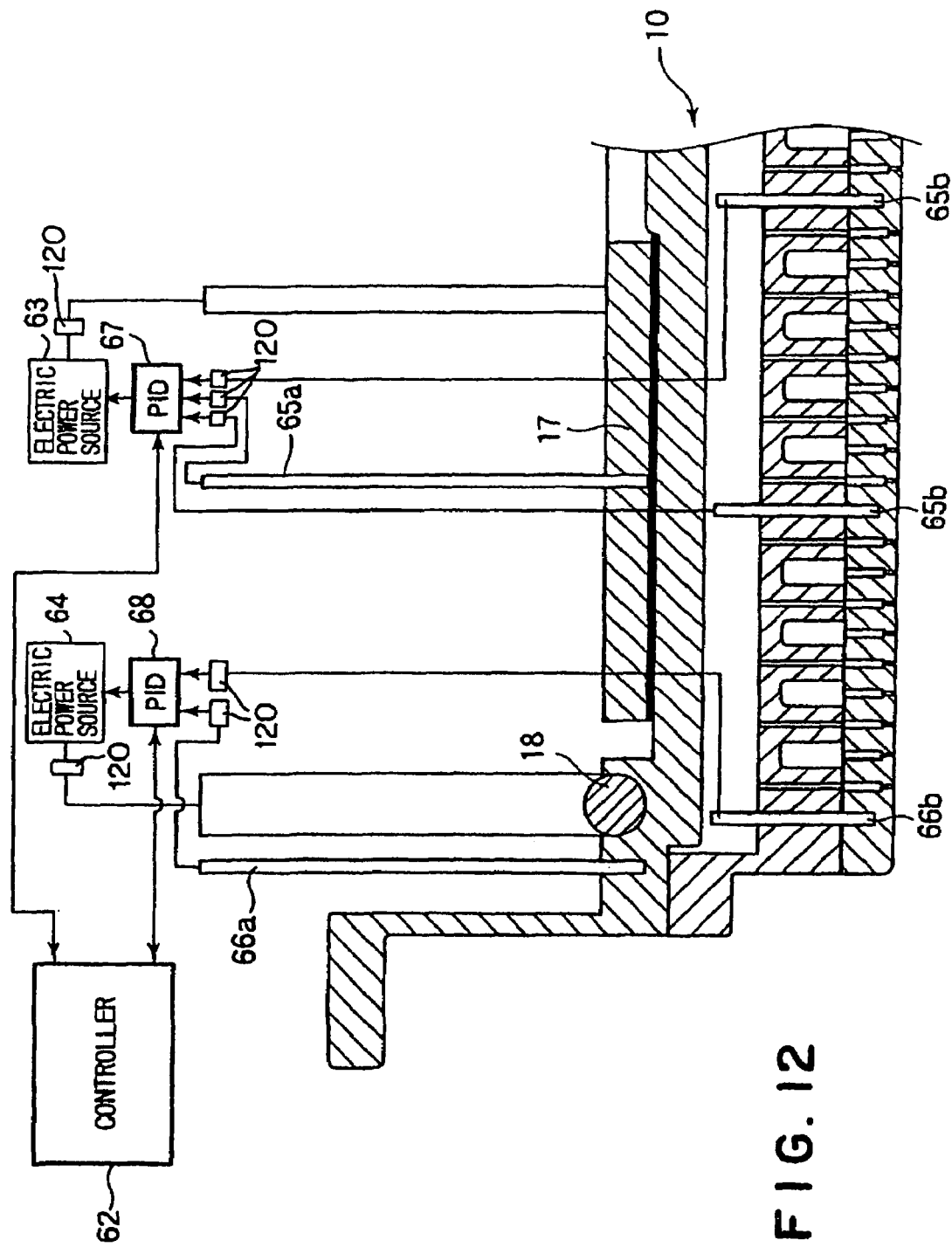
FIG. 12 is a schematic view showing a variant of the portion corresponding to a heating mechanism of FIG. 4.
Figure 13:
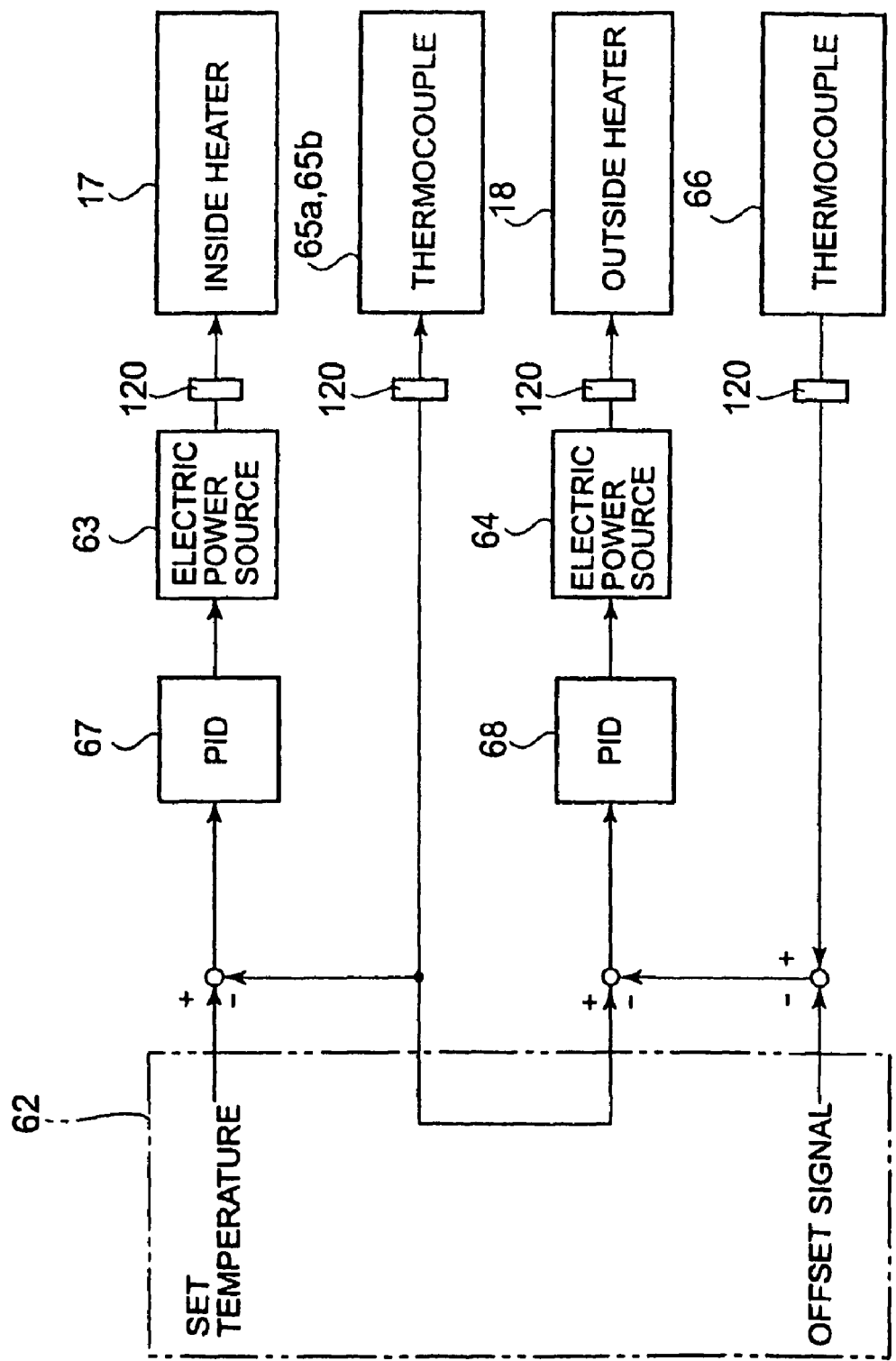
FIG. 13 is a schematic view showing a variant of the control manner of FIG. 5.

FIGS. 12 and 13 show a variant regarding the control system. FIG. 12 is a schematic view showing the variant at a portion corresponding to the heating mechanism of FIG. 4, and FIG. 13 is a view showing the variant of the controlling manner of FIG. 5.

In the case shown in FIGS. 12 and 13, noise filters 120 are provided between the control system and the respective thermocouples 65a, 65b, 66a and 66b, and between the control system and the respective heaters 17 and 18. Preferably, they are arranged nearer to the control system. Providing the noise filters 120 like this is effective in removing noises from the high-frequency electric power source 47 to improve the controlling performance.

In a variant shown in FIG. 14, instead of the circular outside heater 18 having a circular section, a flat doughnut-like outside heater 118 is provided. Like this, the shape of the heater is not limited in particular.

In the variant shown in FIG. 14, an insulating sheet 131 is formed between the inside heater 17 and the upper plate 10a, and an insulating sheet 132 is similarly formed between the outside heater 118 and the upper plate 10a. The thickness of the respective insulating sheets 131 is a degree not affected by noises, for example 0.5 mm to 1.0 mm. The upper plate 10a functions as an electrode for generating plasma, so that the insulating sheets 131 and 132 are preferably thick in order to inhibit effects of the noises that the heaters receive. Herein, the insulating sheets 131 and 132 have to have high heat conductivity and high heat resistance. Thus, ceramics such as aluminum nitride is suitable as a material of the insulating sheets 131 and 132.

Figure 15:
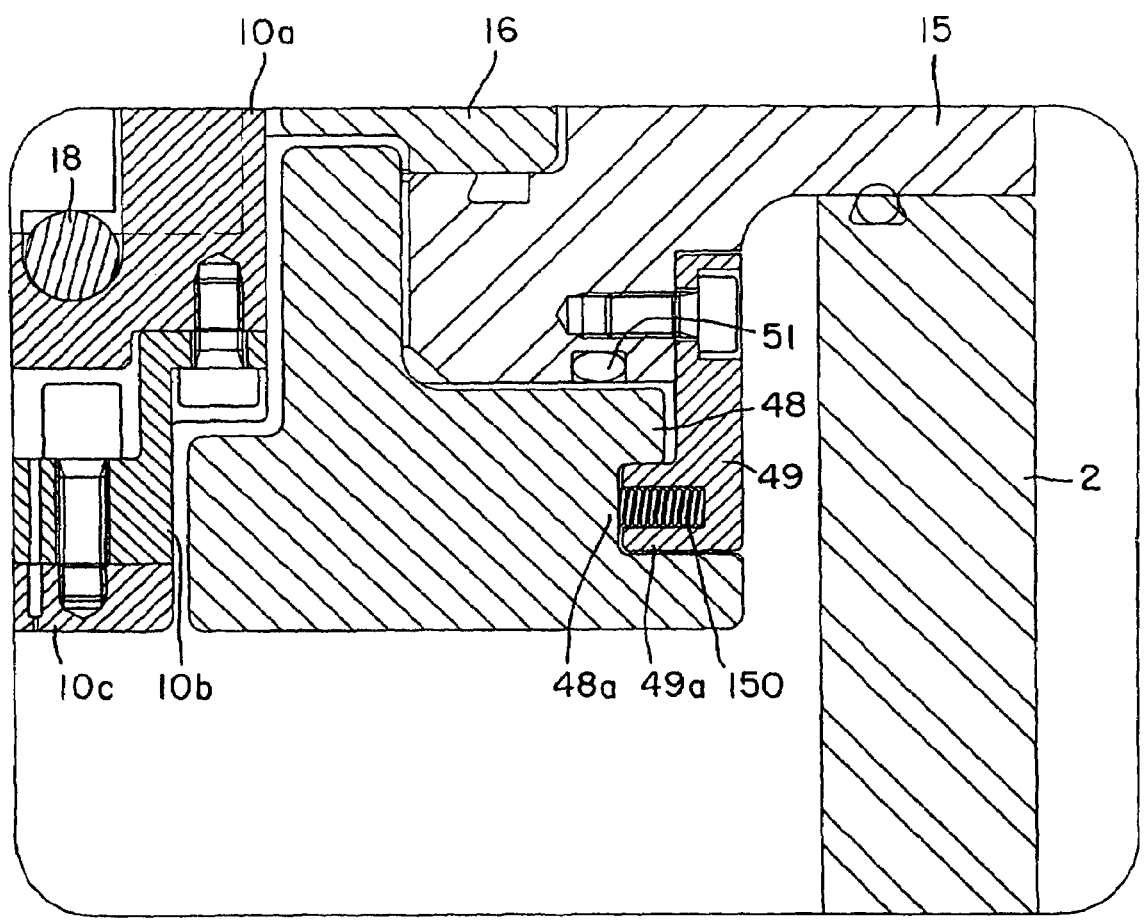
FIG. 15 is a sectional view showing a variant of the filler member of FIG. 3.

In a variant shown in FIG. 15, instead of the elastic member 50 made of a fluorine rubber or the like, a corrosion-resisting metal spring, for example an elastic member 150 made of a Ni-alloy such as inconel, is provided. Like this, the manner of an elastic member interposed between the lateral surface of the concave portion 48a of the filler 48 and the lateral surface of the convex portion 49a of the supporting member 49 is not limited in particular.

Herein, regarding during the idling state and during the cleaning process, the respective features of temperature control according to this invention and prior art are shown in the following table.

|  | Temperature of showerhead | Temperature of pedestal | Operation |
| --- | --- | --- | --- |
| Prior art | 470~480° C. | 640~650° C. | Temperature of pedestal has to be raised not lower than film-forming temperature |
| Invention | 500° C. | 640° C. | Temperature of showerhead is directly controlled |

The invention claimed is:

1. A film-forming apparatus comprising:
    a processing container that defines a chamber,
    a stage arranged in the chamber, on which a substrate to be processed can be placed,
    a showerhead provided opposite to the stage, which has a large number of gas-discharging holes,
    a gas-supplying mechanism that supplies a process gas into the chamber through the showerhead, and
    a showerhead-temperature controlling unit that controls a temperature of the showerhead,
    wherein
    the showerhead-temperature controlling unit is provided in an atmosphere-side part,
    the showerhead-temperature controlling unit includes a heating mechanism that heats the showerhead,
    an annular infilling member is arranged between the showerhead and the processing container,
    the annular infilling member is provided so as to substantially infill a space surrounded by a side wall of the showerhead and a side wall of the processing container,
    the annular infilling member is made of quartz and has a concave portion in an outer circumferential surface thereof,
    an annular lid member is fixed to an upper end of the processing container,
    a fixing member is fixed to the annular lid member by means of screws, and
    the fixing member has a convex portion which is fitted in the concave portion of the annular infilling member via an annular elastic member or a plurality of elastic members.

2. A film-forming apparatus according to claim 1, wherein the showerhead-temperature controlling unit further includes:
    a cooling mechanism that cools the showerhead,
    a temperature-detecting mechanism that detects a temperature of the showerhead, and
    a controller that controls at least the heating mechanism, based on a result detected by the temperature-detecting mechanism.

3. A film-forming apparatus according to claim 1, further comprising
    a plasma-generating unit for generating plasma of the process gas in the chamber.

4. A film-forming apparatus according to claim 1, further comprising
    a inverting mechanism that inverts the showerhead by turning the showerhead outwardly from the chamber.

5. A film-forming apparatus according to claim 1, wherein the showerhead has:
    an upper plate,
    a middle plate including a plurality of the holes, and
    a lower plate including a plurality of gas-jetting holes.

6. A Ti-film-forming apparatus comprising:
    a processing container that defines a chamber,
    a stage arranged in the chamber, on which a substrate to be processed can be placed,
    a showerhead provided opposite to the stage, which has a large number of gas-discharging holes,
    a gas-supplying mechanism that supplies a Ti-including gas and a reduction gas into the chamber through the showerhead,
    a showerhead-temperature controlling unit that controls a temperature of the showerhead, and
    a plasma-generating unit for generating plasma of the Ti-including gas and the reduction gas in the chamber,
    wherein
    the showerhead-temperature controlling unit is provided in an atmosphere-side part,
    the showerhead-temperature controlling unit includes a heating mechanism that heats the showerhead,
    an annular infilling member is arranged between the showerhead and the processing container,
    the annular infilling member is provided so as to substantially infill a space surrounded by a side wall of the showerhead and a side wall of the processing container,
    the annular infilling member is made of quartz and has a concave portion in an outer circumferential surface thereof,
    an annular lid member is fixed to an upper end of the processing container,
    a fixing member is fixed to the annular lid member by means of screws,
    the fixing member has a convex portion which is fitted in the concave portion of the annular infilling member via an annular elastic member or a plurality of elastic members.

7. A Ti-film forming apparatus according to claim 6, wherein the showerhead-temperature controlling unit further includes:
    a cooling mechanism that cools the showerhead,
    a temperature-detecting mechanism that detects a temperature of the showerhead, and
    a controller that controls at least the heating mechanism, based on a result detected by the temperature-detecting mechanism.

8. A Ti-film-forming apparatus according to claim 6, further comprising
    an inverting mechanism that inverts the showerhead by turning the showerhead outwardly from the chamber.

9. A Ti-film-forming apparatus according to claim 6, wherein the showerhead has:
    an upper plate,
    a middle plate including a plurality of holes, and
    a lower plate including a plurality of gas jetting holes.

10. A film-forming apparatus according to claim 3, wherein
    a heater for heating the substrate to be processed is arranged in the stage, and
    an electrode is arranged above the heater.

11. A film-forming apparatus according to claim 6, wherein the showerhead has a concave shape.

12. A film-forming apparatus according to claim 6, wherein
    the gas-supply mechanism includes a cleaning-gas source of a cleaning gas for cleaning a Ti film formed in the processing container.

13. A film-forming apparatus according to claim 6, wherein
    the reduction gas is an $H_2$ gas, and
    the Ti-including gas is a $TiCl_4$ gas.

14. A film-forming apparatus according to claim 1, wherein the heating mechanism heats the showerhead to a temperature not lower than 425° C.

15. A film-forming apparatus according to claim 6, wherein the heating mechanism heats the showerhead to a temperature not lower than 425° C.

* * * * *